United States Patent
Cosgrave

(10) Patent No.: US 7,956,786 B2
(45) Date of Patent: Jun. 7, 2011

(54) DIGITAL-TO-ANALOGUE CONVERTER

(75) Inventor: Gavin Cosgrave, Enniscorthy (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/609,580

(22) Filed: Oct. 30, 2009

(65) Prior Publication Data

US 2011/0102226 A1    May 5, 2011

(51) Int. Cl.
*H03M 1/66* (2006.01)

(52) U.S. Cl. .......................... 341/145; 341/144; 341/154

(58) Field of Classification Search .................. 341/145, 341/154
See application file for complete search history.

(56) References Cited

U.S. PATENT DOCUMENTS

| | | | |
|---|---|---|---|
| 5,495,245 A * | 2/1996 | Ashe | 341/145 |
| 5,808,576 A * | 9/1998 | Chloupek et al. | 341/144 |
| 5,969,657 A * | 10/1999 | Dempsey et al. | 341/145 |
| 6,181,265 B1 * | 1/2001 | Lee | 341/145 |
| 6,201,491 B1 * | 3/2001 | Brunolli et al. | 341/144 |
| 6,414,616 B1 * | 7/2002 | Dempsey | 341/144 |
| 6,567,026 B1 * | 5/2003 | Gorman | 341/154 |
| 7,304,596 B2 * | 12/2007 | Lin et al. | 341/145 |
| 2002/0121995 A1 | 9/2002 | Tabler | |
| 2003/0117307 A1 | 6/2003 | Deak | |
| 2005/0062631 A1 | 3/2005 | Washburn et al. | |
| 2006/0232459 A1 | 10/2006 | Dempsey et al. | |

OTHER PUBLICATIONS

International Search Report dated Dec. 10, 2010, in counterpart International application No. PCT/US2010/053180.

* cited by examiner

*Primary Examiner* — Khai M Nguyen
(74) *Attorney, Agent, or Firm* — Kenyon & Kenyon LLP

(57) ABSTRACT

An N-bit DAC comprises a main DAC circuit having main nodes on which analogue voltages are produced of progressively increasing values in steps of the value of one MSB value, and a sub-DAC circuit having secondary nodes on which analogue voltages are produced of progressively increasing values in steps of the value of one LSB. A main switch network couples the secondary nodes to a selected pair of main nodes as the MSB value of the digital input signal varies. A secondary switch network selectively couples one of secondary nodes to an output terminal for providing an analogue voltage output signal. The main nodes are coupled between main terminals, and a voltage reference is applied across input terminals. A first offset circuit and a first compensating circuit are selectively coupleable between the main DAC circuit and the input terminals for offsetting the main node analogue voltages downwardly.

23 Claims, 7 Drawing Sheets

DIGITAL-TO-ANALOGUE CONVERTER

FIELD OF THE INVENTION

The present invention relates to a digital-to-analogue converter (DAC), and in particular, to a DAC of the type which is configured in the form of a main DAC and a sub-DAC, whereby a group of higher order bits, generally referred to as the most significant bits (MSBs) of an input code are converted by the main DAC, and a group of lower order bits, commonly referred to as the least significant bits (LSBs) of the input code are converted in the sub-DAC. In particular, the invention relates to such a DAC in which major code transition glitches can be minimised during operation of the DAC, although the invention is not limited to minimising such glitches in a DAC. Such major code transition glitches occur when the input code changes by a value corresponding to one MSB. The invention also relates to a method for operating such a DAC for minimising major code transition glitches.

BACKGROUND TO THE INVENTION

DACs of the type which are configured in the form of a main DAC and a sub-DAC are well known. For example, such a DAC is disclosed in U.S. Pat. No. 5,969,657 of Dempsey, et al. Another such DAC so configured is disclosed in U.S. Pat. No. 6,567,026 of Gorman, and a DAC somewhat similar to the DAC disclosed in U.S. Pat. No. 6,567,026 is disclosed in U.S. Pat. No. 5,495,245 of Ashe.

Such DACs, in general, comprise a main DAC which comprises one or more main impedance strings formed by a plurality of series connected main impedance elements. The main impedance string or strings are coupled between a first terminal and a second terminal across which a voltage reference is coupled. Typically, each main impedance element of the main impedance string corresponds to the value of one MSB, and the main impedance string defines a plurality of nodes on which voltage signals of progressively increasing selectable values are produced for producing a voltage signal corresponding to the value of the MSBs of the major code part of an input code of a digital input signal. In general, each main impedance element is a resistive element provided by a resistor.

The sub-DAC may be of the type which comprises a secondary impedance string comprising a plurality of series connected secondary impedance elements, and typically, each secondary impedance element corresponds to the value of one LSB. In general, the secondary impedance elements are resistive elements, generally provided by resistors. In general, the secondary impedance string defines a plurality of secondary nodes on which voltage signals of progressively increasing selectable values are produced for producing a voltage signal corresponding to the value of the LSBs of the minor code part of an input code of the digital input signal. The main DAC and the sub-DAC co-operate so that the voltage signal appearing on one of the secondary nodes, in general, as well as including the value of the LSBs also includes the value of the MSBs of the input code. In such cases a secondary switch network is provided for selectively coupling an analogue output terminal of the DAC to an appropriate one of the secondary nodes which provides the analogue output voltage corresponding to the value of the MSBs and the LSBs of the input code.

In general, a main switch network is provided associated with the main impedance string, which has the effect of sliding the secondary impedance string along the main impedance string for progressively increasing or decreasing the value of the voltage signal corresponding to the value of the MSBs supplied from the main DAC to the sub-DAC.

A decoding circuit for decoding input codes of the digital input signal provides switch select signals to the main and secondary switch networks for appropriately operating the switch networks for providing an analogue output voltage on the output terminal corresponding to the values of the input codes of the digital input signal.

Problems arise with such DACs which are configured in the form of a main DAC/sub-DAC configuration at major code transitions when the sub-DAC is moved from interpolating across one main impedance element to the next adjacent main impedance element, in other words, when the value of the MSBs of the input code of the digital input signal changes by one MSB. During major code transitions from one MSB to the next MSB, a relatively large voltage spike develops in the analogue output voltage. Such voltage spikes are commonly referred to as major code transition glitches, and are measured by determining the energy or the magnitude of the voltage spike resulting from the major code transition. Such major code transition glitches cause serious problems where a DAC is being used in a closed-loop control application or where a DAC is being used as a pulse width modulator. In cases where a DAC is used in a control loop application, and the control loop settles around a major code transition, each time the DAC transitions from one major code to the next, a major code transition glitch occurs in the analogue output voltage. Where a transitioning from one LSB to the next LSB occurs without a major code transition occurring, the average analogue output voltage on the output terminal of the DAC is $$\frac{V_1 + V_2}{2},$$

where $V_1$ is the voltage on the output terminal before the LSB transition, and $V_2$ is the voltage on the output terminal after the LSB transition. However, when the transition from one LSB to the next LSB occurs at a major code transition, the average analogue output voltage is no longer the average of the voltage before the transition and the voltage after the transition, due to the voltage spike resulting from the major code transition glitch.

Similarly, where such a DAC is used as a pulse width modulator, if the main DAC is cycling around a major code transition, a major code transition glitch occurs twice during each cycle. Accordingly, the analogue output voltage of the DAC is no longer the average of the high and low voltages on each side of the major code transition.

Another problem with major code transition glitches occurring in a DAC which is used in a closed-loop control application is that the glitches themselves may disturb the control loop.

Various attempts have been made to minimise voltage disturbance caused by major code transition glitches. For example, the DAC of Gorman disclosed in U.S. Pat. No. 6,567,026 reduces the voltage spikes of major code transition glitches. However, while such attempts to reduce the voltage disturbance caused by major code transition glitches have undoubtedly been successful to some extent, problems still arise with major code transition glitches in DACs where such DACs are used in closed-loop control circuits and pulse width modulation circuits.

There is therefore a need for a DAC in which major code transition glitches are minimised during operation of the DAC, and there is also a need for a method for minimising major code transition glitches during the operation of a DAC.

The present invention is directed towards providing a DAC, and the invention is also directed towards providing a DAC in which major code transition glitches are minimised. The invention is also directed towards providing a method for minimising major code transition glitches in a DAC.

SUMMARY OF THE INVENTION

According to the invention there is provided a digital-to-analogue converter (DAC) for converting an input code to an analogue output signal, the DAC comprising:
  a main DAC circuit configured in the form of a main impedance string circuit for producing an analogue signal corresponding to the value of the most significant bits (MSBs) of the input code,
  a sub-DAC circuit for producing an analogue signal corresponding to the value of the least significant bits (LSBs) of the input code, the sub-DAC circuit and the main DAC circuit co-operating for producing the analogue output signal on an output terminal of value corresponding to the input code,
  level shifting circuit for selectively altering the voltage value of the analogue output signal by a predetermined voltage value, and
  a control circuit responsive to the input code for operating the level shifting circuit to alter the voltage value of the analogue output signal by the predetermined voltage value, and for altering the value of the LSBs of the input code applied to the sub-DAC circuit by a value corresponding to the predetermined voltage value to compensate for the alteration of the voltage value of the analogue output signal by the level shifting circuit.

In one embodiment of the invention the predetermined voltage value by which the level shifting circuit alters the voltage value of the analogue output signal is at least one LSB.

In another embodiment of the invention the predetermined voltage value by which the level shifting circuit alters the voltage value of the analogue output signal is approximately the value one half of one MSB.

In a further embodiment of the invention the level shifting circuit is adapted for altering the value of the MSB component of the analogue output signal.

In one aspect of the invention the level shifting circuit is selectively co-operable with one of the main DAC circuit and the sub-DAC circuit for altering the voltage level of the analogue output signal by the predetermined voltage value.

In one embodiment of the invention the digital-to-analogue converter further comprises first and second input terminals adapted to receive a voltage reference from which the analogue output signal is derived.

In another embodiment of the invention the main DAC circuit extends between first and second main terminals, and the sub-DAC circuit extends between first and second secondary terminals, one of the main DAC circuit and the sub-DAC circuit being adapted for receiving the voltage reference on the corresponding ones of the first and second main and secondary terminals from the first and second input terminals, and the level shifting circuit is co-operable with at least one of the corresponding ones of the first and second main and secondary terminals of the one of the main DAC circuit and the sub-DAC circuit which is adapted for receiving the voltage reference for altering the value of the voltage reference applied to the said one of the main DAC circuit and the sub-DAC circuit.

Preferably, a pair of level shifting circuits are provided cooperating with the respective corresponding ones of the first and second main and secondary terminals of the one of the main DAC circuit and the sub-DAC circuit which is adapted for receiving the voltage reference, the level shifting circuits being alternately co-operable with the corresponding ones of the first and second main and secondary terminals.

Advantageously, the one of the first main terminal and the first secondary terminal corresponding to the one of the main DAC circuit and the sub-DAC circuit which is adapted for receiving the voltage reference is connected to the first input terminal through an electrically conductive path, and the one of the second main terminal and the second secondary terminal of the one of the main DAC and the sub-DAC which is adapted for receiving the voltage reference is connected to the second input terminal through an electrically conductive path, and each level shifting circuit comprises an offset circuit selectively switchable into one of the electrically conductive paths.

Ideally, each level shifting circuit comprises a compensating circuit for compensating for the change in voltage resulting from switching the offset circuit into the corresponding electrically conductive path, the compensating circuit of each level shifting circuit is selectively switchable into the other of the two electrically conductive paths.

In one embodiment of the invention the offset and compensating circuits are alternately switchable into the corresponding electrically conductive paths.

In another embodiment of the invention the level shifting circuit is selectively co-operable with the main DAC circuit, and the main DAC circuit comprises an impedance string comprising a plurality of series connected main impedance elements extending between the first main terminal and the second main terminal and defining a plurality of main nodes therebetween, and the first main terminal is connected to one of the first input terminal and the sub-DAC circuit through an impedance path, and the second main terminal is connected to one of the second input terminal and the sub-DAC circuit, and the level shifting circuit is selectively switchable into one of the electrically conductive paths for altering the voltage applied to the main DAC circuit.

Preferably, a pair of level shifting circuits is provided, the level shifting circuits being selectively and alternately switchable into respective ones of the electrically conductive paths.

Advantageously, each level shifting circuit comprises an offset circuit selectively switchable into the corresponding one of the electrically conductive paths, and a compensating circuit selectively switchable in parallel with the impedance element of the main DAC circuit which is connected directly to the other one of the electrically conductive paths.

In one embodiment of the invention the offset and compensating circuits of each level shifting circuit are simultaneously switchable to co-operate with the main DAC for altering the voltage applied thereto.

Preferably, the offset and compensating circuits cooperate with the main DAC circuit for maintaining the impedance of the main DAC circuit presented to the first and second input terminals substantially constant.

Advantageously, each offset circuit comprises an offset impedance element, and each compensating circuit comprises a compensating impedance element.

Ideally, the value of the offset and compensating impedance elements of each circuit are selected to shift the voltages produced on the main nodes of the main DAC circuit by the predetermined voltage value.

In one embodiment of the invention each offset impedance element comprises a resistive element and each compensating impedance element comprises a resistive element.

In alternative embodiment of the invention the level shifting circuit co-operates with the analogue output terminal for altering the analogue voltage on the analogue output terminal by the predetermined voltage value, and preferably, the level shifting circuit is connected to the analogue output terminal.

In another embodiment of the invention the control circuit is responsive to the input code being indicative of a major code transition for operating the level shifting circuit for altering the voltage value of the analogue output signal by the predetermined voltage value.

The invention also provides a method for operating a digital-to-analogue converter for converting an input code to an analogue output signal with major code transition glitches minimised, the method comprising:
  providing a main DAC circuit configured in the form of a main impedance string circuit for producing an analogue signal corresponding to the value of the most significant bits (MSBs) of the input code,
  providing a sub-DAC circuit for producing an analogue signal corresponding to the value of the least significant bits (LSBs) of the input code, the sub-DAC circuit and the main DAC circuit co-operating for producing the analogue output signal on an output terminal of value corresponding to the input code,
  providing a level shifting circuit for selectively altering the voltage value of the analogue output signal by a predetermined voltage value, and
  providing a control circuit responsive to the input code for operating the level shifting circuit to alter the voltage value of the analogue output signal by the predetermined voltage value, and for altering the value of the LSBs of the input code applied to the sub-DAC circuit by a value corresponding to the predetermined voltage value to compensate for the alteration of the voltage value of the analogue output signal by the level shifting circuit.

ADVANTAGES OF THE INVENTION

The advantages of the invention are many. By virtue of the fact that the level shifting circuit is provided for altering the analogue voltage of the analogue output signal by the predetermined voltage value, if the DAC commences to settle around a major code transition, the level shifting circuit can be operated for altering the analogue voltage of the analogue output signal by the predetermined voltage value, and the LSBs of the input codes to be applied to the sub-DAC circuit can then be altered to compensate for the alteration of the analogue output signal by the predetermined voltage value, thereby avoiding the main DAC circuit having to transition from one major code to the next. By adapting the level shifting circuit to alter the analogue output voltage by a voltage value equivalent to the value of half of one MSB, optimum operation of the DAC is achieved.

By virtue of the fact that cycling of the DAC around a major code transition is minimised, the DAC according to the invention is particularly suitable for use in a pulse width modulating circuit application, and is also particularly suitable for use in a closed-loop control application.

By providing the level shifting circuit in the form of an offset circuit and a compensating circuit, a further advantage of the invention is achieved, in that the total value of the impedance of the main DAC circuit remains unaltered when the level shifting circuit is selected. A further advantage of providing the level shifting circuit in the form of an offset circuit and a compensating circuit is that the value of the steps between the MSB values of the main DAC circuit remains constant at the value of one MSB when the level shifting circuit is selected.

The advantage of providing a pair of level shifting circuits is that the range of LSB values of the digital input signal which can be accommodated without a major code transition in the main DAC circuit is increased.

The advantages of the method according to the invention are similar to those achieved by the DAC according to the invention.

The invention and its many advantages will be readily apparent from the following description of some preferred embodiments thereof, which are given by way of example only, with reference to the accompanying drawings.

DETAILED DESCRIPTION OF PREFERRED EMBODIMENTS OF THE INVENTION

Figure 1:
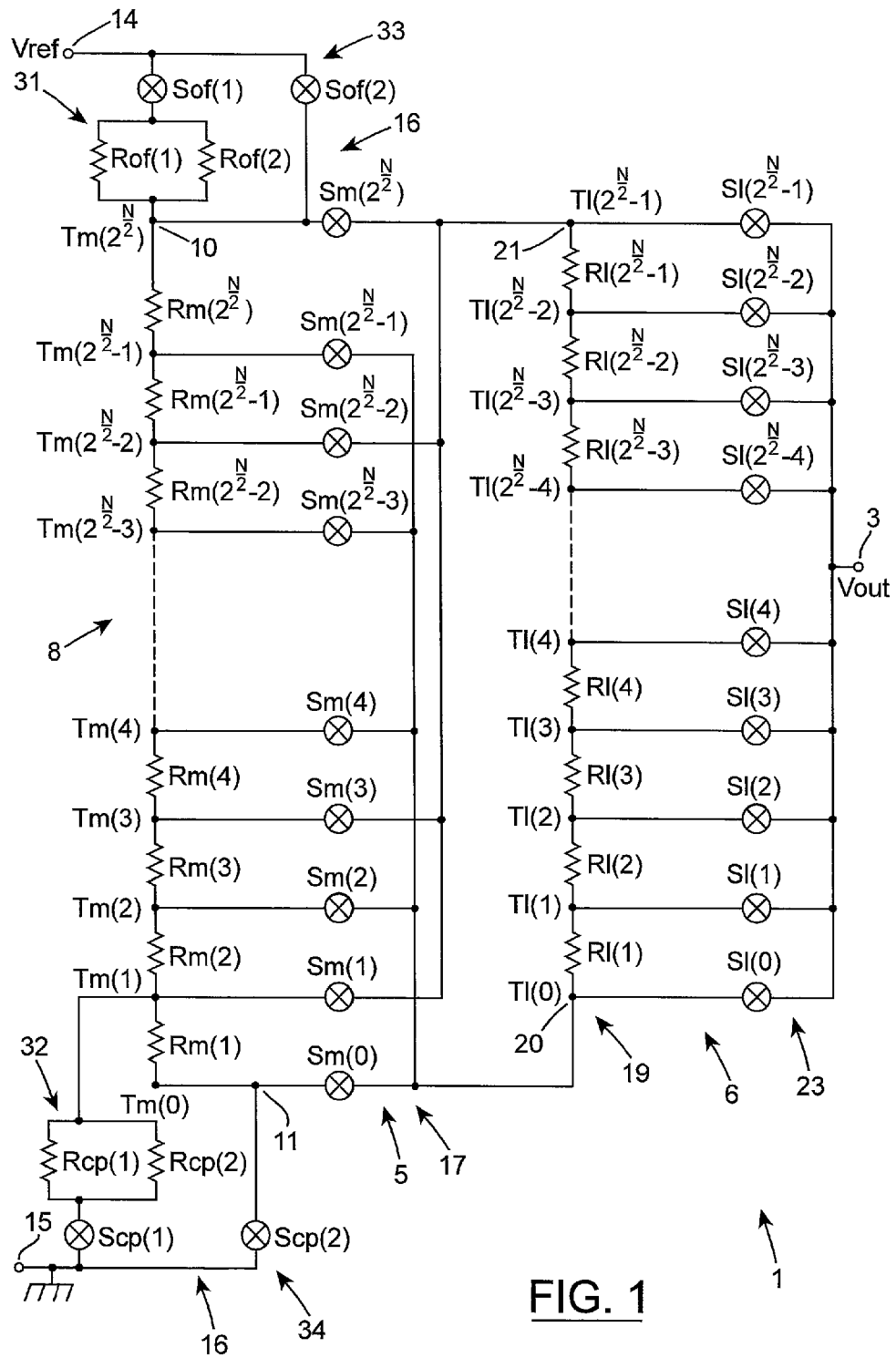
FIG. 1 is a circuit diagram of a portion of a DAC according to the invention.
Figure 2:
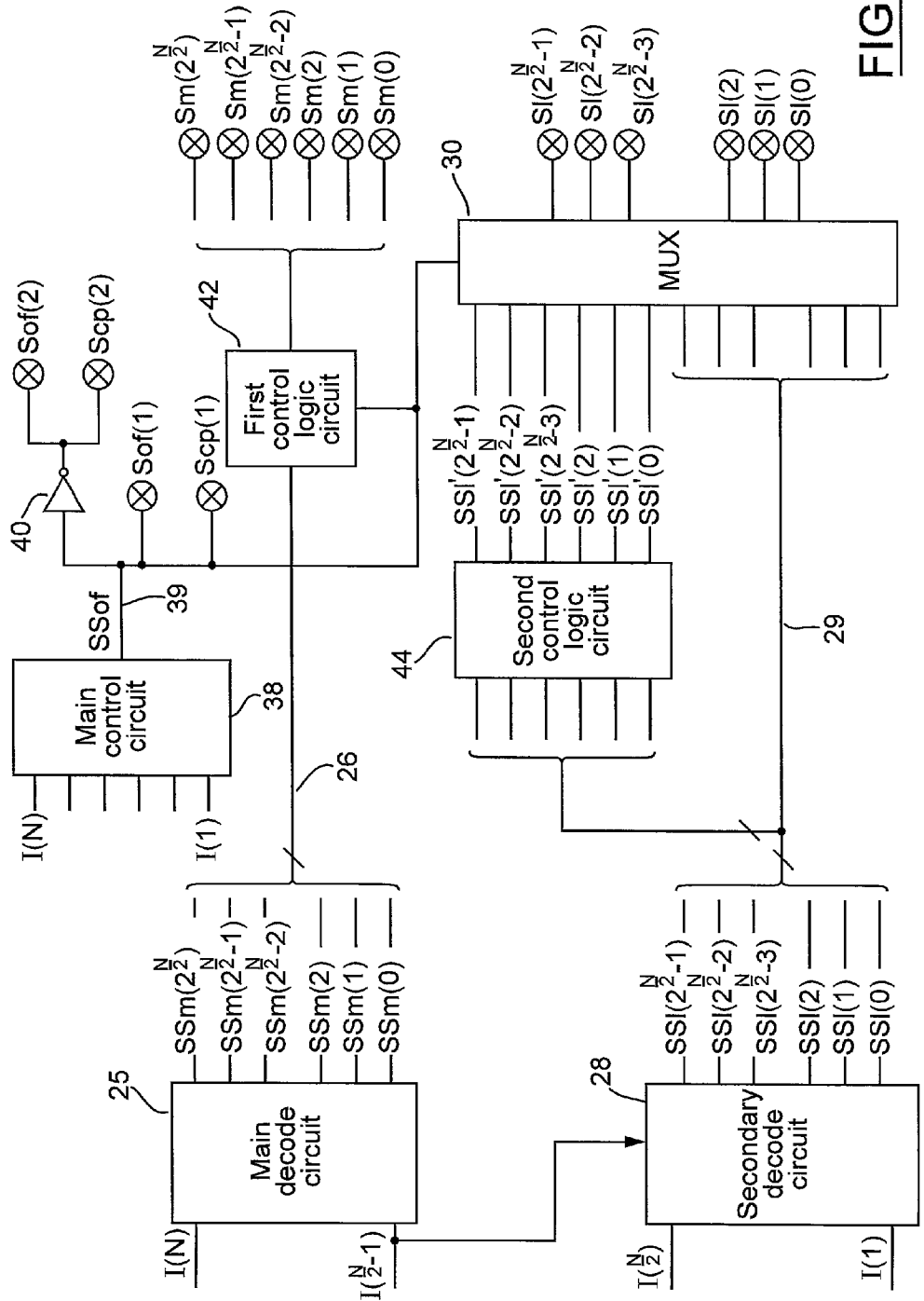
FIG. 2 is a block representation of decoding circuitry for the DAC of FIG. 1.
Figure 3:
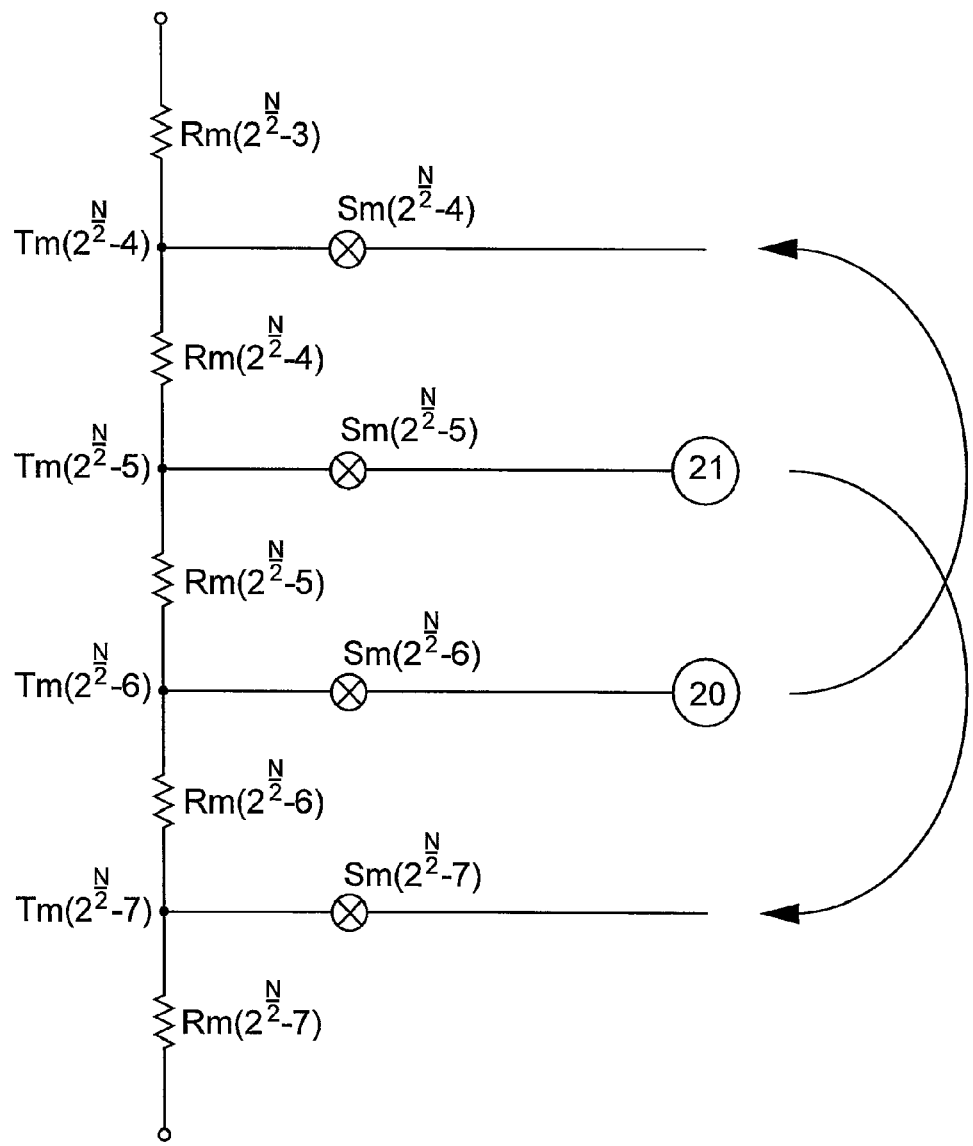
FIG. 3 is a circuit diagram of a portion of the circuit of the DAC of FIG. 1.

Referring to the drawings and initially to FIGS. 1 to 3 thereof, there is illustrated an N-bit DAC according to the invention, indicated generally by the reference numeral 1, for sequentially converting N-bit input code of an N-bit digital input signal to an analogue output voltage $V_{out}$, which is provided on an output terminal 3, and in which cycling of the DAC 1 around major code transitions is minimised, thereby minimising the number of major code transition glitches. In this embodiment of the invention N is an even number, and the input code is divided into a major code of $$\frac{N}{2}$$

MSBs and a minor code of $$\frac{N}{2}$$

LSBs. The DAC 1 comprises a main DAC circuit 5 for converting the MSBs, namely, bits $$I\left(\frac{N}{2}+1\right)$$

to I(N) of the input code, and a sub-DAC circuit 6 for converting the LSBs, namely, bits I(1) to $$I\left(\frac{N}{2}\right)$$

of the input code. The main DAC circuit 5 comprises a main impedance string 8 coupled between first and second main terminals 10 and 11, respectively, and comprising a plurality of series connected main impedance elements, namely, $$2^{\frac{N}{2}}$$

main resistors Rm(1) to $$Rm\left(2^{\frac{N}{2}}\right)$$

The main resistors Rm are of similar resistance values to each other, and are sized so that the voltage drop across each main resistor Rm corresponds to the value of one MSB. A voltage reference $V_{ref}$ is applied across the main impedance string 8 through first and second input terminals 14 and 15, respectively, the first and second main terminals 10 and 11 being selectively coupleable to the first and second input terminals 14 and 15 through a level shifting circuit 16, as will be described in detail below. In this embodiment of the invention the second input terminal 15 is a ground terminal.

The main impedance string 8 defines a plurality of main nodes Tm(0) to $$Tm\left(2^{\frac{N}{2}}\right),$$

which are defined by the junctions of the main resistors Rm(1) to $$Rm\left(2^{\frac{N}{2}}\right).$$

The main node Tm(0) coincides with the second main terminal 11, and the main node $$Tm\left(2^{\frac{N}{2}}\right)$$

coincides with the first main terminal 10. The main nodes Tm(1) to $$Tm\left(2^{\frac{N}{2}}-1\right)$$

are defined between adjacent ones of the main resistors Rm(1) to $$Rm\left(2^{\frac{N}{2}}\right)$$

Analogue voltage signals of progressively increasing voltage values in steps corresponding to the value of one MSB are provided on the main nodes Tm(0) to $$Tm\left(2^{\frac{N}{2}}\right),$$

the lowest voltage value appearing on the main node Tm(0), and the highest voltage value appearing on the main node $$Tm\left(2^{\frac{N}{2}}\right).$$

A main switch network 17 comprising a plurality of main switches Sm(0) to $$Sm\left(2^{\frac{N}{2}}\right)$$

selectively couples the sub-DAC circuit to a selected adjacent pair of the main nodes Tm(0) to $$Tm\left(2^{\frac{N}{2}}\right)$$

across a selected one of the main resistors Rm(1) to $$Rm\left(2^{\frac{N}{2}}\right)$$

for selecting an analogue voltage signal from the main DAC circuit 5 corresponding to the value of the MSBs of the input code, the digital input signal, and for applying the voltage signal to the sub-DAC circuit 6.

The sub-DAC circuit 6 comprises a secondary impedance string 19 comprising a plurality of series connected secondary impedance elements, namely, $$\left(2^{\frac{N}{2}}-1\right)$$

secondary resistors Rl(1) to $$Rl\left(2^{\frac{N}{2}}-1\right).$$

The secondary resistors Rl are of similar resistance values to each other, and are sized so that the voltage drop across each resistor Rl corresponds to the value of one LSB of the input code. In this embodiment of the invention the resistance value of each secondary resistor Rl is equal to twice the resistance value of one of the main resistors Rm. The secondary impedance string 19 defines a plurality of secondary nodes Tl(0) to $$Tl\left(2^{\frac{N}{2}}-1\right),$$

which are defined by the junctions of the secondary resistors Rl(1) to $$Rl\left(2^{\frac{N}{2}}-1\right).$$

The secondary node Tl(0) coincides with a first secondary terminal 20 of the secondary impedance string 19, and the secondary node $$Tl\left(2^{\frac{N}{2}}-1\right)$$

coincides with a second secondary terminal 21 of the secondary impedance string 19. The secondary nodes Tl(1) to $$Tl\left(2^{\frac{N}{2}}-2\right)$$

are defined between adjacent ones of the secondary resistors Rl(1) to $$Rl\left(2^{\frac{N}{2}}-1\right).$$

Analogue voltage signals corresponding to the LSB values of the digital input signal summed with the voltage signal corresponding to the MSB value of the digital input signal from the main DAC circuit 5 appear on the nodes Tl(0) to $$Tl\left(2^{\frac{N}{2}}-1\right),$$

and depend on the coupling configuration of the sub-DAC circuit 6 to the main DAC circuit 5 by the main switch network 17.

A secondary switch network 23 comprising secondary switches Sl(0) to $$Sl\left(2^{\frac{N}{2}}-1\right)$$

selectively couples the analogue output terminal 3 to an appropriate one of the secondary nodes Tl(0) to $$Tl\left(2^{\frac{N}{2}}-1\right)$$

for providing the analogue output voltage signal on the analogue output terminal 3 corresponding to the input code of the digital input signal. The appropriate one of the secondary nodes Tl(0) to $$Tl\left(2^{\frac{N}{2}}-1\right)$$

is selected in response to the value of the LSBs of digital input signal as will be described below.

A main decoding circuit 25, see FIG. 2, sequentially decodes the MSB value $$I\left(\frac{N}{2}+1\right)$$

to I(N) of the digital input signal, and outputs main switch select signal SSm(0) to $$SSm\left(2^{\frac{N}{2}}\right)$$

on a main switch select bus 26 for operating the main switches Sm(0) to $$Sm\left(2^{\frac{N}{2}}\right)$$

of the main switch network 17 so that only the appropriate two of the main switches Sm(0) to $$Sm\left(2^{\frac{N}{2}}\right)$$

are operated in the closed circuit state for coupling the first and second secondary terminals 20 and 21 of the secondary impedance string 19 to an appropriate pair of the main nodes Tm(0) to $$Tm\left(2^{\frac{N}{2}}\right),$$

and the remaining ones of the main switches Sm(0) to $$Sm\left(2^{\frac{N}{2}}\right)$$

are operated in the open circuit state. A secondary decoding circuit 28 sequentially decodes the LSBs I(1) to $$I\left(2^{\frac{N}{2}}\right)$$

of the minor code of the digital input signal, and outputs switch select signals SSl(0) to $$SSl\left(2^{\frac{N}{2}}-1\right)$$

on a secondary switch select bus 29 and through a multiplexer 30 for operating the secondary switches Sl(0) to $$Sl\left(2^{\frac{N}{2}}-1\right)$$

of the secondary switch network 23 in a first mode, as will be described below, so that only the appropriate one of the secondary switches Sl(0) to $$Sl\left(2^{\frac{N}{2}}-1\right)$$

is operated in the closed circuit state for coupling the appropriate one of the secondary nodes Tl(0) to $$Tl\left(2^{\frac{N}{2}}-1\right)$$

to the output terminal 3, and the remaining secondary switches Sl(0) to $$Sl\left(2^{\frac{N}{2}}-1\right)$$

are operated in the open circuit state.

The DAC 1 and the main and secondary decoding circuits 25 and 28 up to here are substantially similar to the DACs described in U.S. Pat. No. 5,969,657 of Dempsey, et al, and the content of U.S. Pat. No. 5,969,657 is incorporated herein by reference. The operation of the DAC 1 up to here is also similar to the operation of the DACs described in U.S. Pat. No. 5,969,657 when the secondary switch network 23 is operated in the first mode, and the main and secondary switch networks 17 and 23 are operated to produce the switching sequence described in U.S. Pat. No. 5,969,657. Thus, when the main switch network 17 is being operated to accommodate a major code transition in the input code of the digital input signal, the main switches Sm(0) to $$Sm\left(2^{\frac{N}{2}}\right)$$

are operated so that one of the first and second secondary terminals 20 and 21 of the secondary impedance string 19, which is coupled to one of the main nodes Tm(0) to $$Tm\left(2^{\frac{N}{2}}-1\right)$$

is retained coupled to that main node, and the other one of the first and second secondary terminals 20 and 21 of the secondary impedance string 19 is decoupled from the main node Tm(0) to $$Tm\left(2^{\frac{N}{2}}-1\right)$$

to which it had been coupled and is coupled to the main node Tm(0) to $$Tm\left(2^{\frac{N}{2}}-1\right)$$

on the other side of the main node Tm(0) to $$Tm\left(2^{\frac{N}{2}}-1\right)$$

to which the one of the first and second secondary terminals 20 and 21 of the secondary impedance string 19 is retained coupled. In other words, one of the first and second secondary terminals 20 and 21 of the secondary impedance string 19 is stepped over the other one of the first and second secondary terminals 20 and 21 during a major code transition.

For example, referring to FIG. 3, if the secondary impedance string 19 is coupled across the main resistor $$Rm\left(2^{\frac{N}{2}}-5\right)$$

by the main switches $$Sm\left(2^{\frac{N}{2}}-6\right)$$

and $$Sm\left(2^{\frac{N}{2}}-5\right),$$

with the first secondary terminal 20 of the secondary impedance string 19 coupled by the main switch $$Sm\left(2^{\frac{N}{2}}-6\right)$$

to the main node $$Tm\left(2^{\frac{N}{2}}-6\right),$$

and the second secondary terminal 21 of the secondary impedance string 19 coupled to the main node $$Tm\left(2^{\frac{N}{2}}-5\right)$$

by the main switch $$Sm\left(2^{\frac{N}{2}}-5\right),$$

if the major code transition is to result in an increase voltage signal from the main impedance string 8 by the value of one MSB, the main switch $$Sm\left(2^{\frac{N}{2}}-5\right)$$

is retained in the closed state, thus continuing to maintain the second secondary terminal 21 coupled to the main node $$Tm\left(2^{\frac{N}{2}}-5\right),$$

however, the first secondary terminal 20 is decoupled from the main node $$Tm\left(2^{\frac{N}{2}}-6\right)$$

by the main switch $$Sm\left(2^{\frac{N}{2}}-6\right),$$

which is operated into the open circuit state, and is in turn coupled to the main node $$Tm\left(2^{\frac{N}{2}}-4\right)$$

by operating the main switch $$Sm\left(2^{\frac{N}{2}}-4\right)$$

in the closed circuit state. If the major code transition was to have resulted in a decrease in the voltage signal from the main impedance string 8 by the value of one MSB, the main switch $$Sm\left(2^{\frac{N}{2}}-6\right)$$

would have been held in the closed circuit state, thus retaining the first secondary terminal 20 coupled to the main node $$Tm\left(2^{\frac{N}{2}}-6\right),$$

and the secondary terminal 21 would have been switched from the main node $$Tm\left(2^{\frac{N}{2}}-5\right)$$

to the main node $$Tm\left(2^{\frac{N}{2}}-7\right)$$

by operating the main switches $$Sm\left(2^{\frac{N}{2}}-5\right)$$

and $$Sm\left(2^{\frac{N}{2}}-7\right)$$

in their reverse states. The secondary switch signals SSl(0) to $$SS1\left(2^{\frac{N}{2}}-1\right)$$

outputted by the secondary decoding circuit 28 for operating the secondary switches Sl(0) to $$S1\left(2^{\frac{N}{2}}-1\right)$$

take account of which one of the first and second secondary terminals 20 and 21 of the secondary impedance string 19 is coupled to the higher voltage one of the pair of the main nodes Tm(0) to $$Tm\left(2^{\frac{N}{2}}\right)$$

of the main impedance string 8. A full description of the operation of main and secondary switch networks of a DAC, which is similar to the DAC 1, and in which the operating sequence of the switches of the switch networks is similar to that of the DAC 1 is given in U.S. Pat. No. 5,969,659, and further description should not be required here.

In accordance with this embodiment of the invention, the level shifting circuit 16 comprises a first offset circuit 31 and a first compensating circuit 32, which are selectively coupleable with the main DAC circuit 5 for offsetting the voltage values on the main nodes Tm(1) to $$Tm\left(2^{\frac{N}{2}}\right)$$

downwardly by a predetermined voltage value, namely, a first offset voltage value, which in this embodiment of the invention corresponding to one half of the value of one MSB, so that if the input code of the digital input signal would result in the main DAC circuit 5 settling around a major code transition, each time the change in the LSB value of the digital input signal is about to result in a major code transition downwardly, the major code transition in the main DAC circuit 5 can be avoided as will be described below by selectively switching in the first offset and compensating circuits 31 and 32, which offset the voltage values on the main nodes Tm(1) to $$Tm\left(2^{\frac{N}{2}}\right)$$

downwardly by the value of half of one MSB.

The first offset circuit 31 comprises a first offset impedance provided by a pair of parallel coupled first offset resistors, namely, Rof(1) and Rof(2) which are each of similar value to the value of one of the main resistors Rm(1) to $$Rm\left(2^{\frac{N}{2}}\right),$$

thereby providing a first offset impedance value equivalent to half the value of the resistance of one of the main resistors Rm(1) to $$Rm\left(2^{\frac{N}{2}}\right).$$

A first switch network 33 comprising first and second offset switches Sof(1) and Sof(2) selectively and alternately couples the first main terminal 10 to the first input terminal 14 through the first offset circuit 31 when the first offset circuit 31 is selected, and couples the first main terminal 10 directly to the first input terminal 14 when the first offset circuit 31 is not to be selected. The first offset switch Sof(1) is operated in the closed circuit state and the second offset switch Sof(2) is operated in the open circuit state when the first offset circuit 31 is selected for coupling the main DAC circuit 5 to the first input terminal 14 through the first offset circuit 31, and the first and second offset switches Sof(1) and Sof(2) are operated in the reverse states for coupling the main DAC circuit 5 directly to the first input terminal 14 when the first offset circuit 31 is deselected.

The first compensating circuit 32 comprises a first compensating impedance element, namely, a pair of parallel connected first compensating resistors Rcp(1) and Rcp(2) which are coupled to the main node Tm(1). A second switch network 34 comprising second compensating switches Scp(1) and Scp(2) for selectively and alternately coupling the main DAC circuit 5 to the second input terminal 15 through the first compensating circuit 32 when the first offset circuit 31 is selected, and for coupling the main DAC circuit 5 directly to the second input terminal 15 when the first offset circuit 31 is deselected. The first compensating switch Scp(1) is operated in the closed circuit state for coupling the main node Tm(1) of the main DAC circuit 5 to the second input terminal 15 through the first compensating circuit 32 and the second compensating switch Scp(2) is operated in the open circuit state for disconnecting the second main terminal 11 of the main DAC circuit 5 from the second input terminal 15 when the first offset circuit 31 is selected, and the first and second compensating switches are operated in the reverse states when the first offset circuit 31 is deselected. The first and second compensating switches Scp(1) and Scp(2) are operated simultaneously with the first and second offset switches Sof(1) and Sof(2).

A main control circuit 38 is responsive to the digital input signal I(1) to I(N) output of the main decoding circuit 25 for outputting a switch select signal SSof on a switch select signal line 39 for simultaneously operating the first offset and compensating switches Sof(1) and Scp(1) in the open circuit state for coupling the main DAC circuit 5 to the first and second input terminals 14 and 15 through the first offset and compensating circuit 31 and 32, respectively, when the value of the current input code of the digital input signal relative to the previous input code thereof is indicative of an upward major code transition. The switch select signal SSof is applied to the second offset and compensating switches Sof(2) and Scp(2) through an inverter 40 for simultaneously operating the second offset and compensating switches Sof(2) and Scp(2) in the open circuit state when first offset and compensating switches Sof(1) and Scp(1) are operated in the closed circuit state, and vice versa. The first offset and compensating circuits 31 and 32 are deselected by the main control circuit 38 when the value of the current input code of the digital input signal relative to the previous input code thereof is indicative of an upward major code transition. Accordingly, the provision of the first offset and compensating circuits 31 and 32 avoid the main DAC circuit 5 transitioning between adjacent major codes when the LSBs values of the input code of the digital input signal are such as to cause the MSBs values of the input code to alter from the value of one MSB to the next MSB.

A first control logic circuit 42 in response to the switch select signal SSof from the main control circuit 38 holds the main switch select signals SSm(0) to $$SSm\left(2^{\frac{N}{2}}\right)$$

in their state just prior to the switch select signal SSof being outputted by the main control circuit 38 and operating the main DAC circuit in the second mode, thereby preventing the main DAC circuit 5 transitioning from one major code to the next as the first offset and compensating circuit 31 and 32 are being selected.

A second control logic circuit 44 converts the secondary switch select signals SSl(0) to $$SSl\left(2^{\frac{N}{2}}-1\right)$$

from the secondary decoding circuit 28 to secondary switch select signals SS1'(0) to $$SS1'\left(2^{\frac{N}{2}}-1\right)$$

for operating the secondary switches Sl(0) to $$S1\left(2^{\frac{N}{2}}-1\right)$$

of the secondary switch network 23 for in turn operating the sub-DAC circuit 6 in a second mode for providing compensation in the value of the output voltage signal equivalent to the downward offset in the voltages on the main nodes Tm(1) to $$Tm\left(2^{\frac{N}{2}}\right)$$

resulting from the selection of the first offset and compensating circuits 31 and 32, so that the output voltage signal on the output terminal 3 corresponds to the value of the digital words of the input signal. The switch select signals SS1'(0) to $$SS1'\left(2^{\frac{N}{2}}-1\right)$$

are applied to the secondary switches Sl(0) to $$S1\left(2^{\frac{N}{2}}-1\right)$$

of the secondary switch network 23 through the multiplexer 30. The multiplexer 30 is responsive to the switch select signal SSof outputted by the main control circuit 38 for applying the secondary switch select signals SS1'(0) to $$SS1'\left(2^{\frac{N}{2}}-1\right)$$

from the second control logic circuit 44 to the secondary switch network 23 when the first offset and compensating circuits 31 and 32 are selected. Otherwise, the switch select signals SSl(0) to $$SS1\left(2^{\frac{N}{2}}-1\right)$$

directly from the secondary decoding circuit 28 are applied to the secondary switch network 23 through the multiplexer 30.

The second control logic circuit 44 converts the secondary switch select signals SSl(0) to $$SS1\left(2^{\frac{N}{2}}-1\right)$$

to the secondary switch select signals SS1'(0) to $$SS1'\left(2^{\frac{N}{2}}-1\right)$$

so that the appropriate one of the secondary nodes Tl(0) to $$T1\left(2^{\frac{N}{2}}-1\right)$$

of the sub-DAC circuit 6 is selected when the first offset and compensating circuits 31 and 32 are selected, in order that the LSB value selected from the sub-DAC circuit 6 is offset upwardly by one half of the value of one MSB, in order to compensate for the corresponding downward shift of half the value of one MSB on the main nodes Tm(1) to $$Tm\left(2^{\frac{N}{2}}\right)$$

resulting from the selection of the first offset and compensating circuits 31 and 32.

In use, when the DAC 1 is being used in a closed loop application or in a pulse width modulation application, and the first offset and compensating circuits 31 and 32 of the level shifting circuit 16 are initially deselected. When the main control circuit 38 detects that the input code of the digital input signal is about to cause the main DAC circuit 5 to transition downwardly across a major code, the main control circuit 38 outputs the switch select signal SSof on the switch select signal line 39 at logic high, which simultaneously selects the first offset circuit 31 and the first compensating circuit 32 and operates the first control logic circuit 42 for holding the main switch select signals SSm(0) to $$SSm\left(2^{\frac{N}{2}}\right)$$

in the state in which they were in just prior to the major code transition being detected, and operates the multiplexer 30 for applying the secondary switch select signals SS1'(0) to $$SS1'\left(2^{\frac{N}{2}}-1\right)$$

from the second control logic circuit 44 to the secondary switch network 23 for operating the sub-DAC circuit 6 in the second mode, thereby preventing the main DAC circuit 5 from transitioning across a major code. On the input code of the digital input signal increasing to a value corresponding to an upward major code transition, on the main control circuit 38 detecting that the upward major code transition in the input code of the digital input signal, the main control circuit 38 pulls the switch select signal SSof on the switch select signal line 39 low, thereby simultaneously deselecting the first offset circuit 31 and the first compensating circuit 32 and operating the first control logic circuit 42 to allow the main switch select signals SSm(0) to $$SS\left(2^{\frac{N}{2}}\right)$$

through to the main switch network 17, since the main switch signals SSm(0) to $$SSm\left(2^{\frac{N}{2}}\right)$$

are now in the same state as the state in which they had been held by the first control logic circuit 42. Pulling the switch select signal SSof low also operates the multiplexer 30 to apply the secondary switch select signals SSl(0) to $$SSl\left(2^{\frac{N}{2}} - 1\right)$$

directly from the secondary decoding circuit 28 to the secondary switch network 23, thereby again operating the sub-DAC circuit 6 in the first mode.

Figure 4:
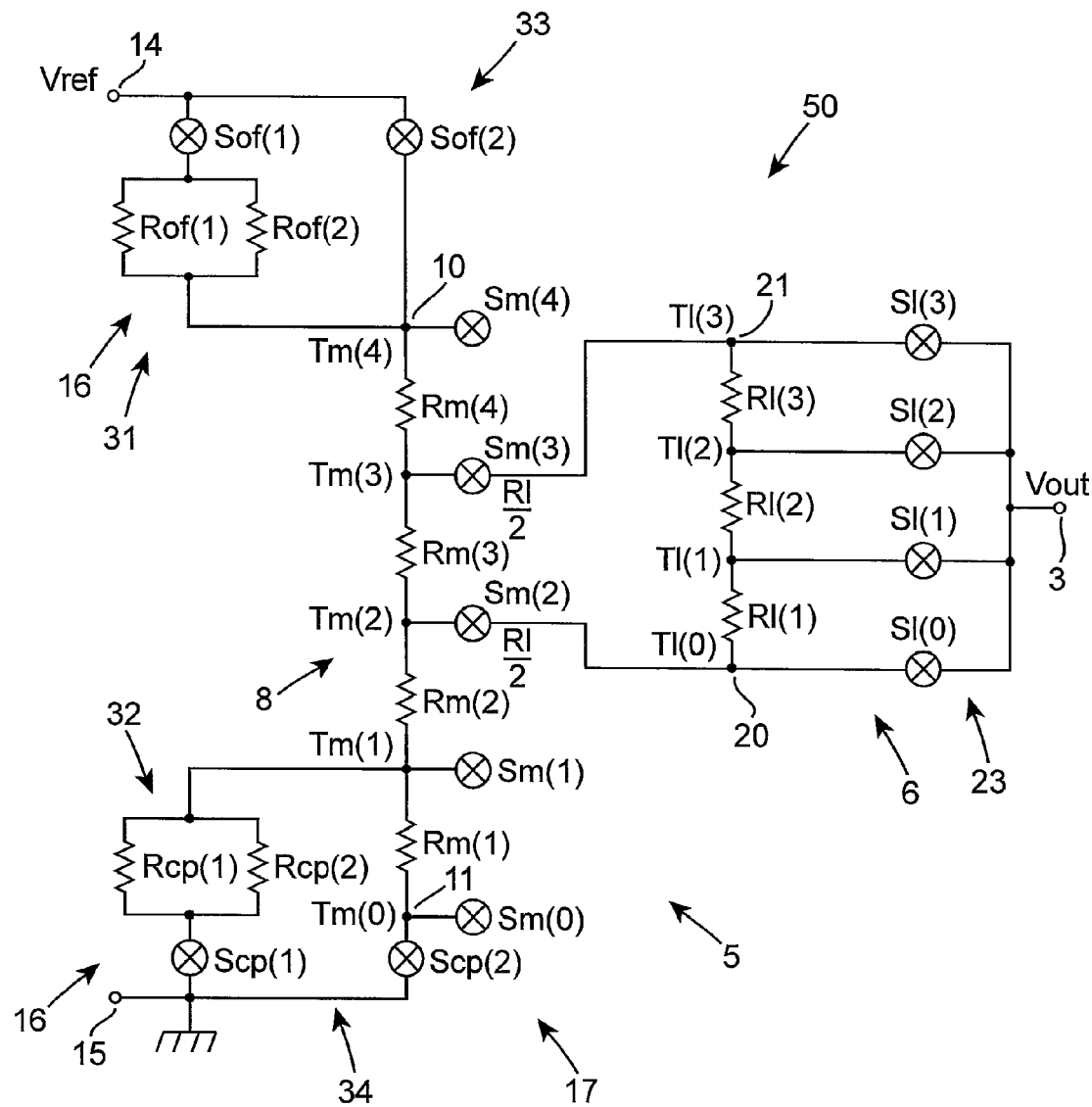
FIG. 4 is a circuit diagram of a portion of a DAC according to another embodiment of the invention.

Referring now to FIG. 4, in order to more fully assist in an understanding of the invention, the operation of a DAC 50 also according to the invention for avoiding major code transitioning of the DAC 50 when the digital input signal is cycling around a major code transition will now be described in detail. The DAC 50 is substantially similar to the DAC 1 and similar components are identified by the same reference numerals. However, for ease of description, the DAC 50 is illustrated as a four bit DAC comprising a main DAC circuit 5 for converting the two most significant bits of the input codes of a digital input signal, and a sub-DAC circuit 6 for converting the two least significant bits of the input codes of the digital input signal. Accordingly, the main impedance string 8 of the main DAC circuit 5 comprises four main resistors, namely, main resistors Rm(1) to Rm(4), which define main nodes Tm(0) to Tm(4). The secondary impedance string 19 of the sub-DAC circuit 6 comprises three secondary resistors Rl(1) to Rl(3) which define secondary nodes Tl(0) to Tl(3). A secondary switch network 23 comprising secondary switches Sl(0) to Sl(3) selectively couples an appropriate one of the secondary nodes Tl(0) to Tl(3) to the main analogue output terminal 3. The main switch network 17 comprises secondary switches Sm(0) to Sm(4) for selectively coupling the sub-DAC circuit 6 to a selected pair of the main nodes Tm(0) to Tm(4) across one of the main resistors Rm(1) to Rm(4). However, for ease of description the sub-DAC circuit 6 is illustrated coupled only to the main nodes Tm(2) and Tm(3) across the main resistor Rm(3) through the main switches Sm(2) and Sm(3). Otherwise, the DAC 50 is similar to the DAC 1, and also comprises a first offset circuit 31 and a first compensating circuit 32. The first offset resistors Rof(1) and Rof(2) of the first offset circuit 31 are of similar resistance values, and each is of similar resistance value to that of one of the main resistors Rm(1). The first compensating resistors Rcp(1) and Rcp(2) of the first compensating circuit 32 are of similar resistance values and are each of similar resistance value to that of one of the main resistors Rm(1) to Rm(4). Thus, when the first offset circuit 31 and the first compensating circuit 32 are simultaneously selected, the MSB values on the main nodes Tm(1) to Tm(4) are offset downwardly by half the value of one MSB.

With the sub-DAC circuit 6 and the main DAC circuit 5 configured as illustrated in FIG. 4 and with the first and second secondary terminals 20 and 21 of the sub-DAC circuit 6 coupled to the main nodes Tm(2) and Tm(3), respectively, through the main switches Sm(2) and Sm(3), and with the first offset circuit 31 and the first compensating circuit 32 deselected, in other words, switched out, assuming that the input codes of digital input signal would be such as to cause the main DAC circuit 5 to cycle around the major code transition corresponding to the MSB value of the main node Tm(2), in which case without the first offset and compensating circuits 31 and 32, the main switch Sm(2) would be operated by the switch select signal SSm(2) continuously in the closed circuit state, thereby continuously coupling the first secondary terminal 20 of the secondary impedance string 19 to the main node Tm(2) of the main impedance string 5. The second secondary terminal 21 of the secondary impedance string 19 would be stepped between the main nodes Tm(3) and Tm(1) through the main switches Sm(3) and Sm(1), respectively each time the input code of the digital input signal transitioned across the major code value on the main mode Tm(2). It is this stepping of the second secondary terminal 21 between the main nodes Tm(3) and Tm(1) which causes the major code transition glitches on each transition of the main DAC circuit 5 across a major code.

However, by selecting the first offset and compensating circuits 31 and 32 of the level shifting circuit 16 as the input code is transitioning downwardly through a major code, and by deselecting the first offset and compensating circuits 31 and 32 as the input code is transitioning upwardly through a major code, the first and second secondary terminals 20 and 21 of the sub-DAC circuit 6 can be maintained coupled to the main nodes Tm(2) and Tm(3) for so long as the value of the input code of the digital input signal does not drop more than the value of half an MSB below the normal MSB voltage value of the main node Tm(2) when the first offset and compensating circuits 31 and 32 are deselected.

The following is a theoretical explanation of the operation of the DAC 50. In this embodiment of the invention each of the main switches Sm(0) to Sm(4) have an on-resistance of (Rm−Rl)/2, and thus produce a 1LSB change at the output when crossing a major code transition. In this case the resistance value of each secondary resistor Rl is equal to twice the value of each main resistor Rm, and accordingly, the on-resistance value Rsm of each main switch is equal to half the resistance value of each secondary resistor Rl.

When the DAC 50 is operating with the first offset and compensating circuits 31 and 32 of the level shifting circuit 16 deselected, the voltage at the secondary node Tl(0), namely, at the second secondary terminal 20 is given by the equation:

$$V_a = V_y + I_{sub} \cdot R_{sm2} \qquad (1)$$

where $V_a$ is the voltage at the secondary node Tl(0), $V_y$ is the voltage at the main node Tm(2), $I_{sub}$ is the current flowing through the secondary impedance string 19, and $R_{sm2}$ is the on-resistance of the main switch Sm(2).

The analogue output voltage on the output terminal 3 when the secondary switch Sl(0) is operated in the closed state and the other three secondary switches Sl(1) to Sl(3) are operated in the open state is equal to $V_a$.

Since the resistance $R_{sm2}$ of the main switch Sm(2) is equal to half the resistance Rl of one of the secondary resistors Rl(1) to Rl(3), equation (1) can be written as follows:

$$V_a = V_y + \tfrac{1}{2}\text{LSB} \tag{2}$$

When the first offset and compensating circuits 31 and 32 of the level shifting circuit 16 are selected, the voltage on each of the main nodes Tm(1) to Tm(4) is shifted downwardly by a voltage corresponding to half the value of one MSB. Thus, with the first offset and compensating circuits 31 and 32 selected, the voltage $V_y'$ at the main node Tm(2) is given by the equation:

$$V_y' = V_y - \tfrac{1}{2}\text{LSB} \tag{3}$$

Since the sub-DAC circuit 6 is a two bit sub-DAC $\tfrac{1}{2}\text{MSB} = 2\text{LSB}$, thus equation (3) can be rewritten as:

$$V_y' = V_y - 2\text{LSB} \tag{4}$$

Therefore, to maintain the analogue output voltage $V_{out}$ on the output terminal 3 at the same voltage as it was when the first offset and compensating circuits 31 and 32 were deselected, the secondary switch network 23 must be operated to couple the output terminal 3 to the secondary node Tl(2) of the secondary impedance string 19. The voltage on the secondary node Tl(2) is given by the following equation:

$$V_z = V_y' + I_{sub} \cdot R_{sm2} + I_{sub} \cdot 2R_1 \tag{5}$$

where
$V_z$ is the voltage on the secondary node Tl(2), and
$R_l$ is the resistance of each of the secondary resistors Rl(1) to Rl(2).

Equation (5) can be rewritten as follows:

$$V_z = V_y' + \tfrac{1}{2}\text{LSB} + 2\text{LSB} \tag{6}$$

Substituting for $V_y'$ from equation (3) in equation (6) gives the following equation:

$$V_z = V_y - \tfrac{1}{2}\text{MSB} + \tfrac{1}{2}\text{LSB} + 2\text{LSB} \tag{7}$$

Since $\tfrac{1}{2}\text{MSB} = 2\text{LSB}$, equation (7) can be rewritten as:

$$V_z = V_y + \tfrac{1}{2}\text{LSB} \tag{8}$$

Therefore, the voltage on the secondary node Tl(2) when the first offset and compensating circuits 31 and 32 are selected is equal to the voltage on the secondary node Tl(0) when the first offset and compensating circuits 31 and 32 are selected.

Accordingly, with the secondary impedance string 19 coupled to the main nodes Tm(2) and Tm(3) of the main impedance string 8 by the main switches Sm(2) and Sm(3) of the main switch network 17, and with the first offset and compensating circuits 31 and 32 deselected, if the input code of the digital input signal were such as to cause the main DAC circuit 5 to cycle about the major code corresponding to the MSB value of the main node Tm(2), just before the main switch Sm(3) is to be operated in the open circuit state and the main switch Sm(1) is to be operated in the closed circuit state, the first offset and compensating circuits 31 and 32 are selected, thus shifting the voltage on the main node Tm(2) downwardly by the value of half an MSB, thereby permitting the analogue output voltage on the output terminal 3 to be reduced further by two LSBs, without having to reconfigure the main switch network 17.

However, since the voltage on the main node Tm(2) has been shifted downwardly by a half the value of one MSB, the voltage on the secondary node Tl(0) has similarly been shifted downwardly by half the value of one MSB, and thus, the output terminal 3 must be coupled to the secondary node Tl(2) in order to provide the half MSB compensation in the sub-DAC circuit 6. Thus, the analogue output voltage on the output terminal 3 can be reduced by two further LSB steps before it is necessary to reconfigure the main switch network 17 by selecting the first offset and compensating circuits of the level shifting circuit 16. However, if the value of the input code does not drop below the value of two LSBs below the major code corresponding to the MSB value of the main node Tm(2), the main switches Sm(2) to Sm(3) can be maintained unaltered during the cycling of the digital input signal about the major code corresponding to the main node Tm(2).

When the digital input signal is increasing, and the output terminal 3 is coupled to the secondary node Tl(3), and the first offset and compensating circuits 31 and 32 of the level shifting circuit 16 are selected, a further increase in the input code of the digital input signal by the value of two LSBs is accommodated by deselecting the first offset and compensating circuits 31 and 32, and operating the secondary switch network 23 so that the output terminal 3 is coupled to the secondary node Tl(1), and the DAC 50 can continue to operate with the main switch network 17 in this configuration until the value of the input code of the digital input signal increases by the value of two LSBs.

A further case exists where the first offset and compensating circuits 31 and 32 are not selected, the main switches Sm(2) and Sm(3) are closed, and the secondary switch Sl(3) is closed, and the digital input increases such as to cause a major code transition, which results in the opening of the main switch Sm(2) and the closing of the main switch Sm(4). In this case, the main switch Sm(3) remains closed, the main switch Sm(2) opens, and the main switch Sm(4) closes. The first offset and compensating circuits 31 and 32 are selected, and the sub-DAC code is increased such that the secondary switch Sl(1) is closed instead of the secondary switch Sl(3). Thus, the major code transition occurs once, but a 1-LSB downward transition from this point will no longer result in a major-code transition. Therefore, the DAC avoids cycling around a major code transition.

Needless to say, the operation of the DAC 50 when the digital input signal is such as to cause the DAC 50 to settle about any of the major codes corresponding to the voltage values on the main nodes Tm(1) to Tm(4) is similar to that described above when the digital input signal is such as to cause the DAC 50 to cycle around the major code corresponding to the main node Tm(2).

Accordingly, the provision of the first offset and compensating circuits 31 and 32 of the level shifting circuit in a four bit DAC permits the value of the input code of the digital input signal to vary by the equivalent of the value of five LSBs before a major code transition occurs in the main DAC circuit. Thus, the DAC circuits according to the invention minimise major code transitioning of the DACs during operation thereof when the DACs are operating in a closed loop application or in a pulse width modulation application.

Figure 5:
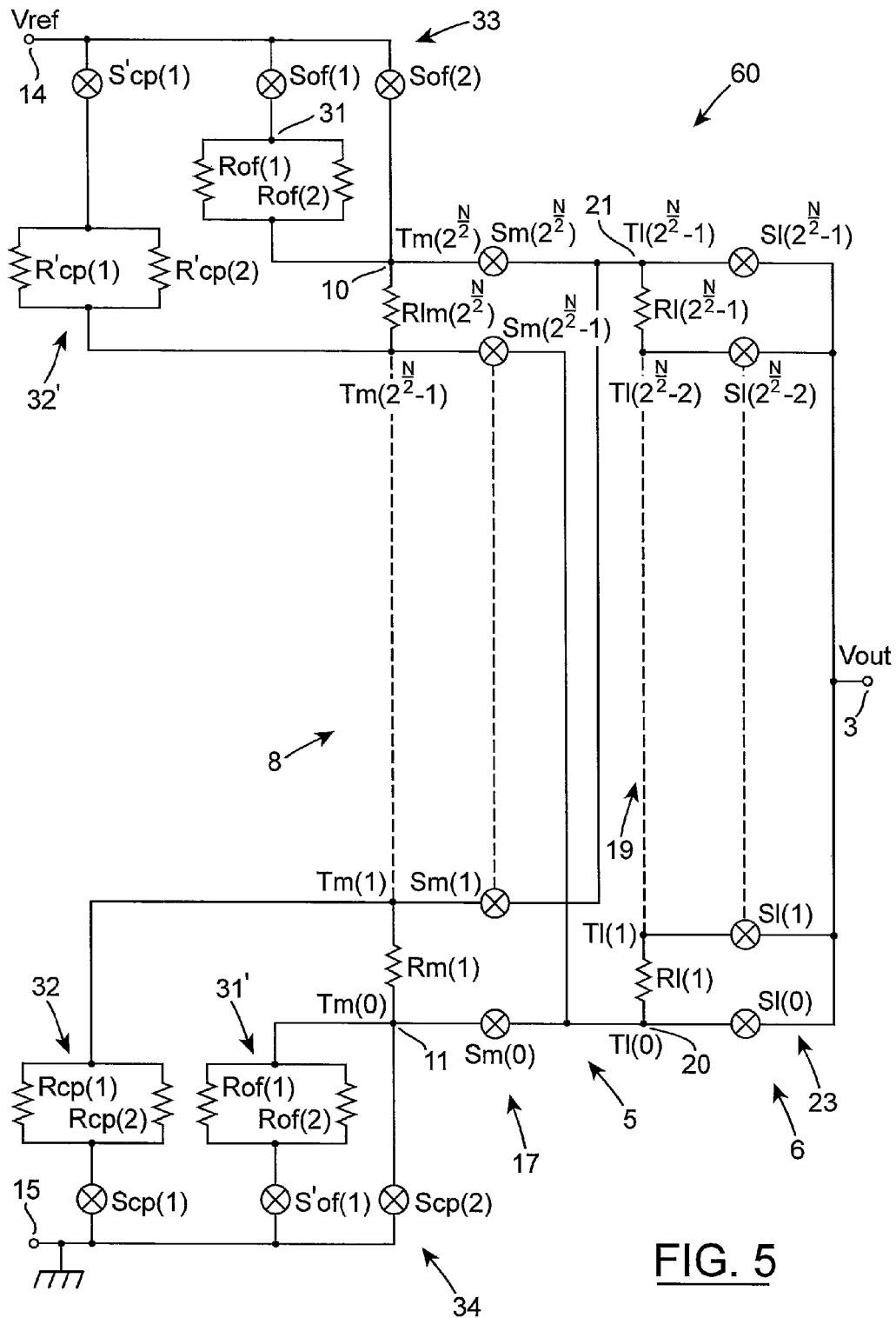
FIG. 5 is a circuit diagram of a DAC according to another embodiment of the invention.

Referring now to FIG. 5, there is illustrated an N-bit DAC, indicated generally by the reference numeral 60, according to another embodiment of the invention. The DAC 60 is substantially similar to the DAC 1 and similar components are identified by the same reference numerals. The DAC 60 comprises a main DAC circuit 5, which is similar to the main DAC circuit 5 of the DAC 1, and comprises a main resistor string comprising series connected main resistors Rm(1) to $$Rm\left(2^{\tfrac{N}{2}}\right),$$

which define main nodes Tm(0) to $$Tm\left(2^{\frac{N}{2}}\right).$$

The main DAC circuit 5 comprises a main switch network 17 comprising main switches Sm(0) to $$Sm\left(2^{\frac{N}{2}}\right).$$

However, for convenience only the main resistors Rm(1) and $$Rm\left(2^{\frac{N}{2}}\right),$$

the main nodes Tm(0), Tm(1) and $$Tm\left(2^{\frac{N}{2}}-1\right)$$

and $$Tm\left(2^{\frac{N}{2}}\right),$$

and the main switches Sm(0), Sm(1) and $$Sm\left(2^{\frac{N}{2}}-1\right)$$

and $$Sm\left(2^{\frac{N}{2}}\right)$$

are illustrated.

The sub-DAC circuit 6 is also similar to the sub-DAC circuit 6 of the DAC 1, and comprises a secondary resistor string 19 comprising a plurality of series connected secondary resistors Rl(1) to $$Rl\left(2^{\frac{N}{2}}-1\right),$$

which define secondary nodes Tl(0) to $$Tl\left(2^{\frac{N}{2}}-1\right).$$

The sub-DAC circuit 6 also comprises a secondary switch network 23 which comprises secondary switches Sl(0) to $$Sl\left(2^{\frac{N}{2}}-1\right).$$

However, for convenience only the secondary resistors Rl(1) and $$Rl\left(2^{\frac{N}{2}}-1\right),$$

the secondary nodes Tl(0), Tl(1), and $$Tl\left(2^{\frac{N}{2}}-2\right)$$

and $$Tl\left(2^{\frac{N}{2}}-1\right),$$

and the switches Sl(0) and Sl(1) and $$Sl\left(2^{\frac{N}{2}}-2\right)$$

and $$Sl\left(2^{\frac{N}{2}}-1\right)$$

are illustrated.

The main difference between the DAC 60 and the DAC 1 is that two level shifting circuits 16 are provided at respective opposite ends of the main DAC circuit 5 by respective first and second offset and compensating circuits 31, 32 and 31' and 32', respectively. The first offset circuit 31 is similar to the first offset circuit 31 of the DAC 1 and the first main terminal 10 of the main DAC circuit 5 is selectively and alternately coupleable directly to the first input terminal 14 and to the first input terminal 14 through the first offset circuit 31 by first and second offset switches Sof(1) and Sof(2) the first switch network 33, as is the case in the DAC 1. The first compensating circuit 32 is similar to the first compensating circuit 32 of the DAC 1, and is coupled to the main node Tm(1). A first compensation switch Scp(1) of the second switch network 34 selectively couples the first compensating circuit 32 to the second input terminal 21 as in the case of the DAC 1. Thus the first and second compensating switches Scp(1) and Scp(2) of the second switch network 34 selectively and alternately couple the main DAC circuit 5 directly to the second input terminal 21 or to the second input terminal 21 through the first compensating circuit 32. Accordingly, when the first offset circuit 31 and the first compensating circuit 32 are selected, the MSB voltage values on the main nodes Tm(1) to $$Tm\left(2^{\frac{N}{2}}\right)$$

are offset downwardly by the value of the voltage drop across the impedance of the first offset circuit 31, which in this case is also half the value of one MSB.

The second offset circuit 31' is similar to the first offset circuit 31 and comprises a pair of parallel connected second offset resistors R'of(1) and R'of(2), which are of similar resistance value to those of the first offset resistors Rof(1) and Rof(2) of the first offset circuit 31. The second main terminal 11 of the main DAC circuit 5 is selectively and alternately coupleable directly to the second input terminal 15, and to the second input terminal 15 through the second offset circuit 31' by the second switch network 34. The switch S'of(1) and the switch S'of (2) of the second switch network 34 acting as the equivalents of the switches Sof(1) and Sof(2), respectively, of the first switch network 33. The second compensating circuit 32' is similar to the first compensating circuit 32, and comprises a pair of parallel connected second compensating resistors R'cp(1) and R'cp(2), which are of similar resistance values to those of the first compensating resistors Rcp(1) and Rcp(2) of the first compensating circuit 32. The second compensating circuit 32' is coupled to the main node $$Tm\left(2^{\frac{N}{2}}-1\right),$$

which is the node defined by the main impedance elements $$Rm\left(2^{\frac{N}{2}}\right),$$

which are closest to the first main terminal 10. The first switch network 33 selectively and alternately couples the main DAC circuit 5 to the first input terminal 14 directly or through the second compensating circuit 32' in similar fashion as the second switch network 34 selectively and alternately couples the main DAC circuit 5 directly to the second input terminal 15 or to the second input terminal 15 through the first compensating circuit 32. In this case the switch S'cp(1) and Sof(2) of the first switch network 33 are the equivalent to the switches Scp(1) and Scp(2), respectively, of the second switch circuit 34.

Accordingly, when the first offset and compensating circuits 31 and 32 are selected with the second offset and compensating circuits 31' and 32' deselected, the MSB voltage values on the main nodes Tm(1) to $$Tm\left(2^{\frac{N}{2}}\right)$$

are shifted downwardly by half the value of one MSB. On the other hand, when the second offset and compensating circuits 31' and 32' are selected, and the first offset and compensating circuits 31 and 32 are deselected, the voltage values on the main nodes Tm(0) to $$Tm\left(2^{\frac{N}{2}}-1\right)$$

are shifted upwardly by half the value of one MSB.

Accordingly, by appropriately selecting one of the first and second offset and compensating circuits 31, 31', and 32, 32', or by deselecting both the first and second offset and compensating circuits 31, 31' and 32, 32', the range of values of the digital input signal which can be accommodated without having to operate the main switch network 17 to cause a major code transition in the main DAC circuit 5 is increased over and above that which is achievable with the DAC 1.

In this embodiment of the invention the main control circuit 38 outputs two switch select signals, namely, switch select SSof and SS'of, on switch select lines 39 and 39'. Both the switch select signals SSof and SS'of are applied through respective inverters 40 and 40' to the switches Sof(2) and Scp(2) of the first and second switch networks 33 and 34. The switch select signal SSof is provided for operating the switches Sof(1) and Scp(1) of the first and second switch networks 33 and 34 in the closed circuit state for selecting the first offset and compensating circuits 31 and 32, and for operating the switches Sof(2) and Scp(2) in the open circuit state. The switch select signal SS'of is provided for operating the switches S'of(1) and S'cp(1) of the first and second switch networks 33 and 34 in the closed circuit state for selecting the second offset and compensating circuits 31' and 32', and for operating the switches Sof(2) and Scp(2) in the open circuit state.

Operation of the DAC 60 is substantially similar to operation of the DACs 1 and 50. When input code of the digital input signal is indicative of a downward major code transition, if neither of the first and second offset and compensating circuits 31, 31' and 32, 32' have been selected, the first offset and compensating circuits 31 and 32 are selected. Alternatively, if when the digital input signal is indicative of a downward major code transition, if the second offset and compensating circuits 31' and 32' had been selected, the second offset and compensating circuits 31' and 32' are deselected. When the digital input signal is indicative of an upward major code transition, if neither of the first and second offset and compensating circuits 31, 31' and 32, 32' are selected, the second offset and compensating circuits 31' and 32' are selected. On the other hand, if the digital input signal is indicative of an upward major code transition, and the first offset and compensating circuits 31 and 32 had been selected, then the first offset and compensating circuits 31 and 32 are deselected. Otherwise, operation of the DAC 60 is similar to that of the DACs 1 and 50.

Figure 6:
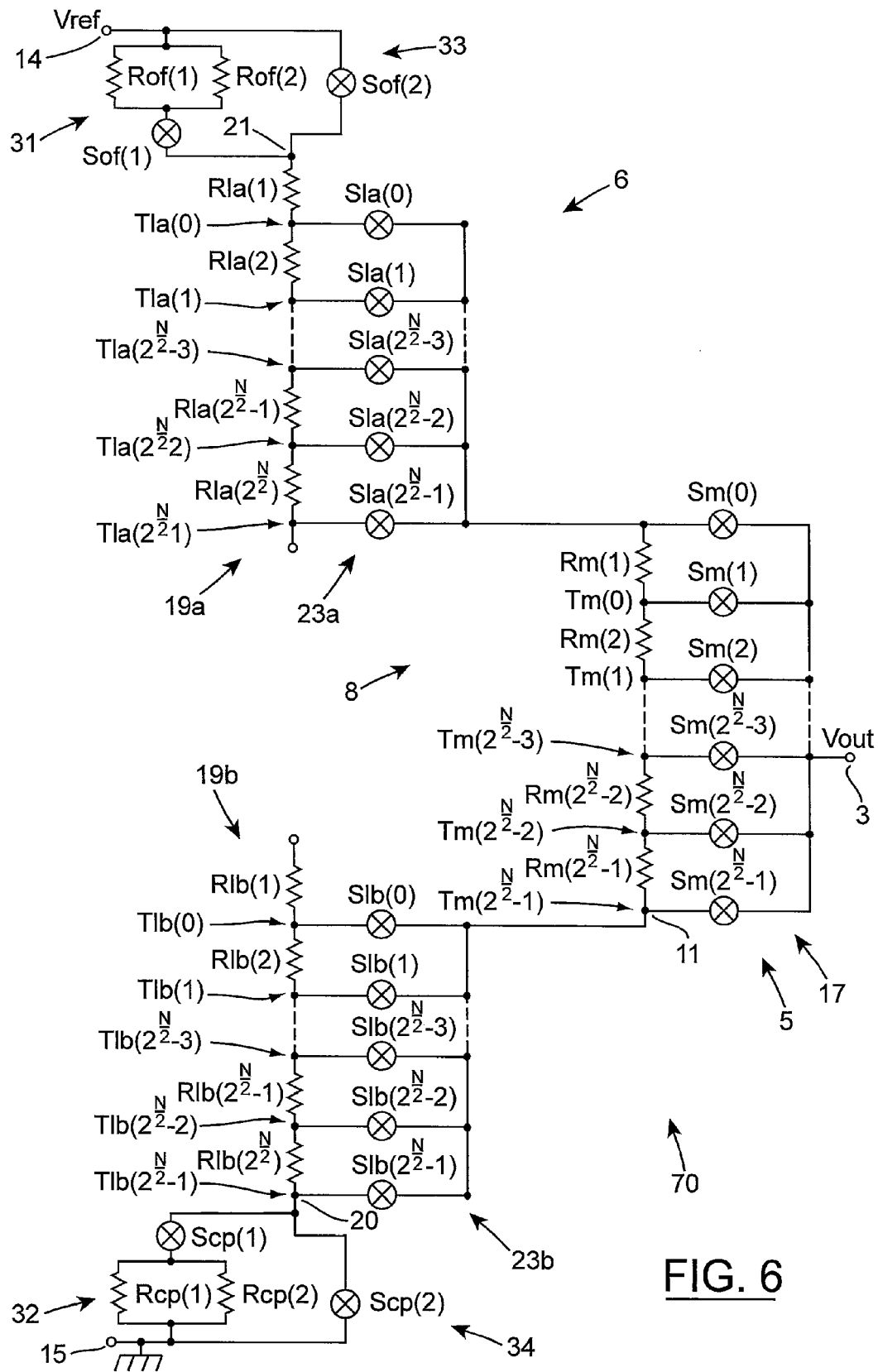
FIG. 6 is a circuit diagram of a DAC according to another embodiment of the invention.

Referring now to FIG. 6, there is illustrated an N-bit resistor string DAC according to another embodiment of the invention, indicated generally by the reference numeral 70. The DAC 70 is of the type disclosed in U.S. Pat. No. 5,495,245 of Ashe with reference to FIG. 7 of the Ashe specification. Where relevant, components of the DAC 70 which correspond to components of the DAC 1 described with reference to FIGS. 1 to 3 are identified by the same reference numerals. The DAC 70 comprises a main DAC circuit 5 and a sub-DAC circuit 6. The voltage reference $V_{ref}$ is applied across the sub-DAC circuit 6, instead of the main DAC circuit 5. The main DAC circuit 5 comprises a main impedance string 8 comprising series connected main resistors Rm1 to $$Rm\left(2^{\frac{N}{2}}-1\right).$$

The sub-DAC circuit 6 comprises a pair of secondary impedance strings, namely, a first secondary resistor string 19a and a second secondary resistor string 19b. The first secondary resistor string 19*a* comprises series connected secondary resistors Rla(1) to $$Rla\left(2^{\frac{N}{2}}\right),$$

and the second secondary resistor string 19*b* comprises series connected secondary resistors Rlb(1) to $$Rlb\left(2^{\frac{N}{2}}\right).$$

The secondary resistors Rla(1) to $$Rla\left(2^{\frac{N}{2}}\right)$$

and Rlb(1) to $$Rlb\left(2^{\frac{N}{2}}\right)$$

are each of resistance value R. The main resistors Rm(1) to $$Rm\left(2^{\frac{N}{2}} - 1\right)$$

are each of resistance value $$2^{\frac{N}{2}}$$

times the resistance value R of the secondary resistors, namely, $$2^{\frac{N}{2}} R$$

resistance value. The main DAC circuit 5 is slideable along the sub-DAC circuit 5 by a pair of secondary switch networks, namely, a first secondary switch network 23*a* and a second secondary switch network 23*b*. The construction and operation of such a resistor string DAC will be well known to those skilled in the art and from the description in U.S. Pat. No. 5,495,245 of Ashe.

The first secondary resistor string 19*a* is selectively and alternately coupleable directly through the second offset switch Sof(2) to the first input terminal 14 to which the voltage reference $V_{ref}$ is applied, and to the first input terminal 14 through the first offset circuit 31 through the first offset switch Sof(1). The first and second offset switches Sof(1) and Sof(2) of the first switch network 33 selectively couple the second secondary terminal 21 to the first input terminal 14 either directly or through the first offset circuit 31. The second secondary resistor string 19*b* is selectively and alternately coupleable directly to the second input terminal 15 and through the first offset compensating circuit 32. The first and second compensating switches Scp(1) and Scp(2) of the second switch network 34 selectively couple the first secondary terminal 20 of the second secondary resistor string 19*b* either directly to the second input terminal 15, or through the first compensating circuit 32 to the second input terminal 15. In this embodiment of the invention the first and second offset resistors Rof(1) and Rof(2), and the first and second compensating resistors Rcp(1) and Rcp(2) are each of similar resistance values, and are each of resistance value equal to the resistance of one of the main resistors Rm(1) to $$Rm\left(2^{\frac{N}{2}} - 1\right)$$

of the main resistor string 8, namely, of resistance value $$2^{\frac{N}{2}} R.$$

The analogue output voltage $V_{out}$ is provided on the analogue output terminal 3, which is selectively coupleable to the main taps Tm(0) to $$Tm\left(2^{\frac{N}{2}} - 1\right)$$

by the main switches Sm(0) to $$Sm\left(2^{\frac{N}{2}} - 1\right)$$

of the main switch network 17.

Normal operation of the DAC 70 is similar to that described in U.S. Pat. No. 5,495,245 of Ashe with reference to FIG. 7 of the Ashe specification, with the exception that the first offset switch Sof(1) and the second compensating switch Scp(2) are operated in the on state, while the second offset switch Sof(2) and the first compensating switch Scp(1) are operated in the off state, so that the second secondary terminal 21 of the first secondary resistor string 19*a* is coupled to the first input terminal 14 through the first offset circuit 31, and the first secondary terminal 20 of the second secondary resistor string 19*b* is coupled directly to the second input terminal 15 through the second compensating switch Scp(2).

When the input code of the digital input signal is indicative of an upward major code transition, the first and second offset and compensating switches Sof(1), Sof(2), Scp(1) and Scp(2) are operated in reverse, in other words, the first offset switch Sof(1) and second compensating switch Scp(2) are operated in the off state, while the second offset switch Sof(2) and first compensating switch Scp(1) are operated in the on state. With the first and second offset and compensating switches Sof(1), Sof(2), Scp(1) and Scp(2) operating in this state, the second secondary terminal 21 of the first secondary resistor string 19*a* is coupled directly to the first input terminal 14 through the second offset switch Sof(2), while the first secondary terminal 20 of the second secondary resistor string 19*b* is coupled to the second input terminal 15 through the first compensating circuit 32. In this configuration the voltage values appearing on the secondary taps Tlb(0) to $$Tlb\left(2^{\frac{N}{2}}\right)$$

of the second secondary resistor string 19b and the secondary taps Tla(0) to $$Tla\left(2^{\frac{N}{2}}\right)$$

of the first secondary resistor string 19a are shifted upwardly by one half of one MSB. Simultaneously, with reversing the operation of the first and second offset and compensating switches Sof(1), Sof(2), Scp(1) and Scp(2) the secondary switches Sla(0) to $$Sla\left(2^{\frac{N}{2}}-1\right)$$

of the first secondary switch network 23a and the secondary switches Slb(0) to $$Slb\left(2^{\frac{N}{2}}-1\right)$$

of the second secondary switch network 23b are operated to couple the main resistor string 8 to the appropriate one of the secondary taps Tla(0) to $$Tla\left(2^{\frac{N}{2}}-1\right)$$

of the first secondary resistor string 19a and to the appropriate one of the taps Tlb(0) to $$Tlb\left(2^{\frac{N}{2}}-1\right)$$

of the secondary resistor string 19b to take account of the upward shift of the voltage values on the secondary taps Tla(0) to $$Tla\left(2^{\frac{N}{2}}-1\right)$$

and Tlb(0) to $$Tlb\left(2^{\frac{N}{2}}-1\right)$$

of the first and second secondary resistor strings 19a and 19b. Thereby the major code transition in the digital input signal can be accommodated without having to switch the output terminal 3 from one of the main taps Tm(1) to $$Tm\left(2^{\frac{N}{2}}-1\right)$$

to the next one of the main taps Tm(0) to $$Tm\left(2^{\frac{N}{2}}-1\right).$$

When the input code of the digital input signal is indicative of a downward major code transition, the first offset switch Sof(1) and the second compensating switch Scp(2) are again operated in the on state, while the second offset switch Sof(2) and the first compensating switch Scp(1) are operated in the off state, thereby shifting the voltage values on the secondary taps Tla(0) to $$Tla\left(2^{\frac{N}{2}}-1\right)$$

of the first secondary resistor string 19a and the secondary taps Tlb(0) to $$Tlb\left(2^{\frac{N}{2}}-1\right)$$

of the second secondary string 19b downwardly by one half of one MSB. The secondary switches Sla(0) to $$Sla\left(2^{\frac{N}{2}}-1\right)$$

of the first secondary switch network 23a and the secondary switches Slb(0) to $$Slb\left(2^{\frac{N}{2}}-1\right)$$

of the second secondary switch network 23b are simultaneously appropriately operated to couple the main resistor string 8 to the appropriate one of the secondary taps Tla(0) to $$Tla\left(2^{\frac{N}{2}}-1\right)$$

of the first secondary resistor string 19a and to the appropriate one of the taps Tlb(0) to $$Tlb\left(2^{\frac{N}{2}}-1\right)$$

of the secondary resistor string 19b to take account of the downward shift of the voltage values on the secondary taps Tla(0) to $$Tla\left(2^{\frac{N}{2}}-1\right)$$

and Tlb(0) to $$Tlb\left(2^{\frac{N}{2}}-1\right)$$

of the first and second secondary resistor strings 19a and 19b. Each time the first and second offset and compensating switches Sof(1), Sof(2), Scp(1) and Scp(2) are operated for shifting the voltage values appearing on the secondary taps Tla(0) to $$Tla\left(2^{\frac{N}{2}}-1\right)$$

and Tlb(0) to $$Tlb\left(2^{\frac{N}{2}}-1\right)$$

of the first and second secondary resistor strings 19a and 19b, respectively, upwardly or downwardly by a half of one MSB to take account of a major code transition in the digital input signal, the secondary switches Sla(0) to $$Sla\left(2^{\frac{N}{2}}-1\right)$$

and Slb(0) to $$Slb\left(2^{\frac{N}{2}}-1\right)$$

of the first and second secondary switch networks 23a and 23b, respectively, are operated appropriately to compensate for the upward or downward shifts of the voltage values on the secondary taps, thereby avoiding having to switch the output terminal 3 from one of the main taps Tm(0) to $$Tm\left(2^{\frac{N}{2}}-1\right)$$

to the next one of the main taps Tm(0) to $$Tm\left(2^{\frac{N}{2}}-1\right).$$

Since at all times either the compensating circuit 32 or the offset circuit 31 is switched into the first and second secondary resistor strings 19a and 19b between the first and second input terminals 14 and 15, respectively, the resistance across the first and second input terminals 14 and 15 remains constant during operation of the DAC 70.

Figure 7:
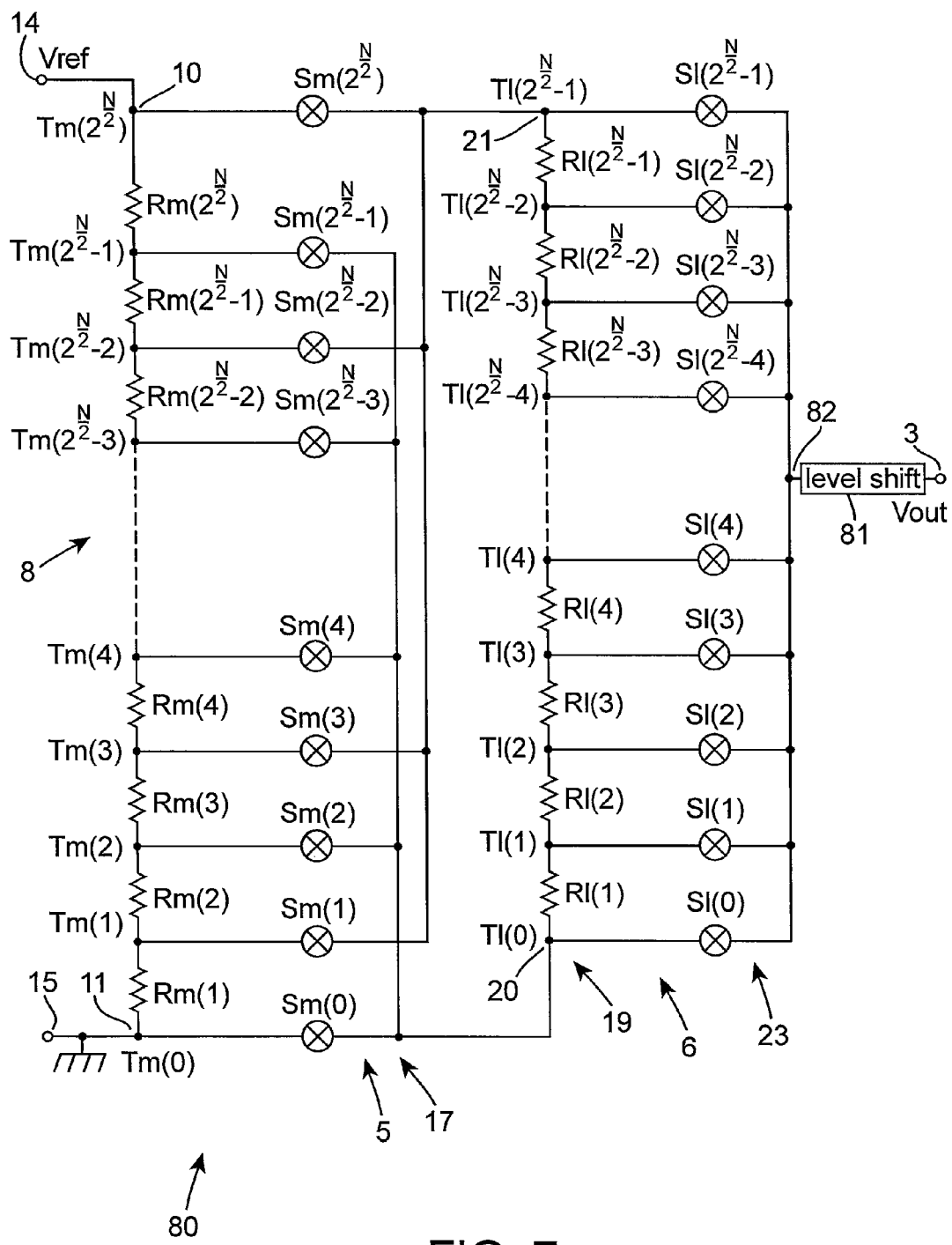
FIG. 7 is a circuit diagram of a DAC according to a further embodiment of the invention.

Referring now to FIG. 7, there is illustrated a DAC according to another embodiment of the invention, indicated generally by the reference numeral 80. The DAC 80 is substantially similar to the DAC 1 described with reference to FIGS. 1 to 3, and similar components are identified by the same reference numerals. In this embodiment of the invention a level shifting circuit 81 is provided, which instead of altering the voltage values on the main nodes Tm(0) to $$Tm\left(2^{\frac{N}{2}}\right)$$

by a half of one MSB, is operable in three modes, namely, a first mode, a second mode and a third mode. In the first ode the level shifting circuit 81 does not alter the voltage appearing on the output terminal 3 relative to the voltage on the node 82 of the sub-DAC circuit 6 produced by the secondary switch network 23, for normal operation of the DAC 80. In other words, in the first mode the voltage appearing on the output terminal 3 is similar to that appearing on the node 82. In the second mode the level shifting circuit level shifts the voltage appearing on the output terminal 3 upwardly relative to the voltage on the node 82 by a half of one MSB. In the third mode the level shifting circuit level shifts the voltage on the output terminal 3 downwardly relative to the voltage on the node 82 by half of one MSB. When the input code of the digital input signal is indicative of an upward major code transition, the level shifting circuit 81 is operable in the second mode for level shifting the voltage on the output terminal 3 upwardly relative to the voltage on the node 82 by half of one MSB and the secondary switch network 23 is operated for coupling the node 82 to the appropriate one of the secondary taps Tl(0) to $$Tl\left(2^{\frac{N}{2}}-1\right)$$

to compensate for the upward shift by which the output voltage $V_{out}$ on the output terminal 3 is upwardly shifted by half of one MSB by the level shifting circuit 81 operating in the second mode. This, thus, avoids the need to operate the main switch network 17 to take account of the major code transition of the digital input signal.

On the other hand, when the DAC 80 is operating with the level shifting circuit 81 operating in the first mode and the input code of the digital input signal is indicative of a downward major code transition, the level shifting circuit 81 is operated in the third mode to level shift the voltage on the output terminal 3 downwardly relative to the voltage on the node 82 by half of one MSB, and the secondary switch network 23 is appropriately operated for coupling the node 82 to the appropriate one of the secondary taps Tl(0) to $$Tl\left(2^{\frac{N}{2}}-1\right)$$

to take account of the downward level shift of half of one MSB applied to the output terminal 3 by the level shifting circuit 81.

Additionally, if the DAC 80 is operating with the level shifting circuit 81 in the third mode and the input code of the digital input signal is indicative of an upward major code transition, the level shifting circuit 81 is operated in the first mode, so that the voltage on the output terminal 3 is similar to the voltage on the node 82, and the secondary switch circuit 23 is appropriately operated for coupling the node 82 to an appropriate one of the secondary taps Tl(0) to $$Tl\left(2^{\frac{N}{2}}-1\right)$$

to compensate for the effective upward shift of half of one MSB which results from operating the level shifting circuit 81 from the third mode to the first mode.

Further, when the level shifting circuit 81 is operating in the second mode and the input code of the digital input signal is indicative of a downward major code transition, the level shifting circuit is operated in the first mode, so that the voltage on the output terminal 3 is similar to the voltage on the node 82, thereby effectively reducing the voltage appearing on the output terminal 3 by half of one MSB and the secondary switch network 23 is operated for coupling the node 82 to the appropriate one of the secondary taps Tl(0) to $$Tl\left(2^{\frac{N}{2}}-1\right).$$

Otherwise, the DAC 80 and its operation is similar to the DAC 1 of FIG. 1 and the DAC 60 of FIG. 5.

While the first offset and compensating circuits of the DACs described with reference to FIGS. 1 to 3 have been described as offsetting the MSB values of the main nodes of the main DAC circuit downwardly, where only one offset and compensating circuit is provided, the offset and compensating circuits may be coupled to the main DAC circuit for offsetting the MSB values of the main nodes upwardly by half the value of one MSB, but would be a value less than one MSB, and would be a value equal to a multiple of one LSB.

Additionally, it will be readily apparent to those skilled in the art that the offset value by which the offset and compensating circuits offset the main nodes of the main DAC circuit may be of any suitable value besides being the value of half the value of one MSB.

Additionally, while the DAC 80 of FIG. 7 has been described as comprising a level shifting circuit which produces two predetermined voltage values, one being a positive and the other being a negative voltage value, it is envisaged in certain cases that the level shifting circuit of the DAC 80 of FIG. 7 may be configured to produce just one single predetermined voltage value, which may be either a positive value or a negative value. Needless to say, the voltage value, be it positive or negative produced by the level shifting circuit may be of any suitable value, other than being equal to a half of one MSB. Indeed, in certain cases, it is envisaged that where two voltage values are provided, one being a positive and one being a negative voltage value, the absolute values of the two voltages may differ. Additionally, the level shifting circuit of the DAC 80 of FIG. 7 could be configured to produce more than two predetermined voltage values.

Additionally, instead of providing the level shifting circuit in the form of an offset circuit and a compensating circuit which comprises the resistors Rof(1), Rof(2), Rcp(1) and Rcp(2), it is envisaged that offset and compensating circuits may be provided which would inject an additional current into either or both the main resistors Rm(1) and $$Rm\left(2^{\frac{N}{2}}\right)$$

of the DACs described with reference to FIGS. 1 to 5 and 8 for in turn altering the voltages developed across the respective main resistors Rm(1) and $$Rm\left(2^{\frac{N}{2}}\right).$$

In one case, the current may be a positive going current, while in the other it may be a negative going current, so that the total voltage across the main impedance string would remain constant irrespective of whether the offset and compensating circuit are selected or otherwise. Alternatively, one or more dummy resistors could be provided at the top and bottom of the main impedance string, and appropriate positive and/or negative going currents could be switched into the dummy resistors. It is also envisaged that in certain cases an offset circuit may be provided without a compensating circuit.

While the DACs have been described with the main and sub-DACs comprising impedance strings of resistive impedance elements, any other suitable impedance elements may be provided besides resistive impedance elements. Additionally, it will be appreciated that while the sub-DAC has been described as being provided by an impedance string DAC, any other suitable sub-DAC may be provided besides a string DAC. Additionally, it will be appreciated that while the DAC 70 described with reference to FIG. 6 has been described as being of the general type described in U.S. Pat. No. 5,969,657 of Ashe, whereby the voltage reference is applied across the secondary DAC circuit, a resistor string DAC of the general type described in U.S. Pat. No. 5,969,657 of Ashe could be provided whereby the voltage reference is applied across the main DAC circuit, and the secondary DAC circuit is slideable along the main DAC circuit. In which case, the offset and compensating circuits would be provided to be selectively coupleable between the respective main impedance strings of the main DAC circuit and the first and second input terminals 14 and 15, respectively. When the voltage reference is applied across the main DAC circuit, the main DAC circuit would be selectively and alternately connectable to the first and second input terminals directly and through the respective offset and compensating circuits. It is also envisaged that a string DAC circuit according to the invention could be provided of the general type disclosed in U.S. Pat. No. 6,567,026 of Gorman.

While in the DAC 60 according to the invention, which is described with reference to FIG. 5, the first and second offset values provided by the first and second offset and compensating circuits have been described as being similar, it is envisaged in certain cases, that the offset values provided by the first offset and compensating circuits may be different to the offset value provided by the second offset and compensating circuits.

The invention claimed is:
1. A digital-to-analogue converter (DAC) for converting an input code to an analogue output signal, the DAC comprising:
a main DAC circuit configured in the form of a main impedance string circuit for producing an analogue signal corresponding to the value of the most significant bits (MSBs) of the input code,
a sub-DAC circuit for producing an analogue signal corresponding to the value of the least significant bits (LSBs) of the input code, the sub-DAC circuit and the main DAC circuit co-operating for producing the analogue output signal on an output terminal of value corresponding to the input code, a level shifting circuit for selectively altering the voltage value of the analogue output signal by a predetermined voltage value, and a control circuit responsive to the input code for operating the level shifting circuit to alter the voltage value of the analogue output signal by the predetermined voltage value, and for altering the value of the LSBs of the input code applied to the sub-DAC circuit by a value corresponding to the predetermined voltage value to compensate for the alteration of the voltage value of the analogue output signal by the level shifting circuit.

2. A digital-to-analogue converter as claimed in claim 1 in which the predetermined voltage value by which the level shifting circuit alters the voltage value of the analogue output signal is at least one LSB.

3. A digital-to-analogue converter as claimed in claim 1 in which the predetermined voltage value by which the level shifting circuit alters the voltage value of the analogue output signal is approximately the value one half of one MSB.

4. A digital-to-analogue converter as claimed in claim 1 in which the level shifting circuit is adapted for altering the value of the MSB component of the analogue output signal.

5. A digital-to-analogue converter as claimed in claim 1 in which the level shifting circuit is selectively co-operable with one of the main DAC circuit and the sub-DAC circuit for altering the voltage level of the analogue output signal by the predetermined voltage value.

6. A digital-to-analogue converter as claimed in claim 1 further comprising first and second input terminals adapted to receive a voltage reference from which the analogue output signal is derived.

7. A digital-to-analogue converter as claimed in claim 6 in which the main DAC circuit extends between first and second main terminals, and the sub-DAC circuit extends between first and second secondary terminals, one of the main DAC circuit and the sub-DAC circuit being adapted for receiving the voltage reference on the corresponding ones of the first and second main and secondary terminals from the first and second input terminals, and the level shifting circuit is co-operable with at least one of the corresponding ones of the first and second main and secondary terminals of the one of the main DAC circuit and the sub-DAC circuit which is adapted for receiving the voltage reference for altering the value of the voltage reference applied to the said one of the main DAC circuit and the sub-DAC circuit.

8. A digital-to-analogue converter as claimed in claim 7 in which a pair of level shifting circuits are provided cooperating with the respective corresponding ones of the first and second main and secondary terminals of the one of the main DAC circuit and the sub-DAC circuit which is adapted for receiving the voltage reference, the level shifting circuits being alternately co-operable with the corresponding ones of the first and second main and secondary terminals.

9. A digital-to-analogue converter as claimed in claim 8 in which the one of the first main terminal and the first secondary terminal corresponding to the one of the main DAC circuit and the sub-DAC circuit which is adapted for receiving the voltage reference is connected to the first input terminal through an electrically conductive path, and the one of the second main terminal and the second secondary terminal of the one of the main DAC and the sub-DAC which is adapted for receiving the voltage reference is connected to the second input terminal through an electrically conductive path, and each level shifting circuit comprises an offset circuit selectively switchable into one of the electrically conductive paths.

10. A digital-to-analogue converter as claimed in claim 9 in which each level shifting circuit comprises a compensating circuit for compensating for the change in voltage resulting from switching the offset circuit into the corresponding electrically conductive path, the compensating circuit of each level shifting circuit is selectively switchable into the other of the two electrically conductive paths.

11. A digital-to-analogue converter as claimed in claim 10 in which the offset and compensating circuits are alternately switchable into the corresponding electrically conductive paths.

12. A digital-to-analogue converter as claimed in claim 8 in which the level shifting circuit is selectively co-operable with the main DAC circuit, and the main DAC circuit comprises an impedance string comprising a plurality of series connected main impedance elements extending between the first main terminal and the second main terminal and defining a plurality of main nodes therebetween, and the first main terminal is connected to one of the first input terminal and the sub-DAC circuit through an impedance path, and the second main terminal is connected to one of the second input terminal and the sub-DAC circuit, and the level shifting circuit is selectively switchable into one of the electrically conductive paths for altering the voltage applied to the main DAC circuit.

13. A digital-to-analogue converter as claimed in claim 12 in which a pair of level shifting circuits is provided, the level shifting circuits being selectively and alternately switchable into respective ones of the electrically conductive paths.

14. A digital-to-analogue converter as claimed in claim 12 in which each level shifting circuit comprises an offset circuit selectively switchable into the corresponding one of the electrically conductive paths, and a compensating circuit selectively switchable in parallel with the impedance element of the main DAC circuit which is connected directly to the other one of the electrically conductive paths.

15. A digital-to-analogue converter as claimed in claim 14 in which the offset and compensating circuits of each level shifting circuit are simultaneously switchable to co-operate with the main DAC for altering the voltage applied thereto.

16. A digital-to-analogue converter as claimed in claim 14 in which the offset and compensating circuits cooperate with the main DAC circuit for maintaining the impedance of the main DAC circuit presented to the first and second input terminals substantially constant.

17. A digital-to-analogue converter as claimed in claim 1 in which each offset circuit comprises an offset impedance element, and each compensating circuit comprises a compensating impedance element.

18. A digital-to-analogue converter as claimed in claim 17 in which the value of the offset and compensating impedance elements of each circuit are selected to shift the voltages produced on the main nodes of the main DAC circuit by the predetermined voltage value.

19. A digital-to-analogue converter as claimed in claim 17 in which each offset impedance element comprises a resistive element and each compensating impedance element comprises a resistive element.

20. A digital-to-analogue converter as claimed in claim 1 in which the level shifting circuit co-operates with the analogue output terminal for altering the analogue voltage on the analogue output terminal by the predetermined voltage value.

21. A digital-to-analogue converter as claimed in claim 20 in which the level shifting circuit is connected to the analogue output terminal.

22. A digital-to-analogue converter as claimed in claim 1 in which the control circuit is responsive to the input code being indicative of a major code transition for operating the level shifting circuit for altering the voltage value of the analogue output signal by the predetermined voltage value.

23. A method for operating a digital-to-analogue converter for converting an input code to an analogue output signal with major code transition glitches minimised, the method comprising:

provided a main DAC circuit configured in the form of a main impedance string circuit for producing an analogue signal corresponding to the value of the most significant bits (MSBs) of the input code, providing a sub-DAC circuit for producing an analogue signal corresponding to the value of the least significant bits (LSBs) of the input code, the sub-DAC circuit and the main DAC circuit co-operating for producing the analogue output signal on an output terminal of value corresponding to the input code, providing a level shifting circuit for selectively altering the voltage value of the analogue output signal by a predetermined voltage value, and providing a control circuit responsive to the input code for operating the level shifting circuit to alter the voltage value of the analogue output signal by the predetermined voltage value, and for altering the value of the LSBs of the input code applied to the sub-DAC circuit by a value corresponding to the predetermined voltage value to compensate for the alteration of the voltage value of the analogue output signal by the level shifting circuit.

\* \* \* \* \*